(12) United States Patent
Masuda et al.

(10) Patent No.: US 11,137,340 B2
(45) Date of Patent: Oct. 5, 2021

(54) PARTICLE DETECTION SENSOR AND PARTICLE DETECTION APPARATUS

(71) Applicant: SHARP KABUSHIKI KAISHA, Sakai (JP)

(72) Inventors: Yoshifumi Masuda, Sakai (JP); Akifumi Yamaguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/698,733

(22) Filed: Nov. 27, 2019

(65) Prior Publication Data
US 2020/0173906 A1      Jun. 4, 2020

Related U.S. Application Data

(60) Provisional application No. 62/773,757, filed on Nov. 30, 2018.

(51) Int. Cl.
*G01N 15/14* (2006.01)
*H01L 31/0203* (2014.01)
*H01L 31/0232* (2014.01)
*H01L 31/167* (2006.01)

(52) U.S. Cl.
CPC ..... *G01N 15/1434* (2013.01); *H01L 31/0203* (2013.01); *H01L 31/02325* (2013.01); *H01L 31/167* (2013.01); *G01N 2015/1486* (2013.01); *G01N 2015/1493* (2013.01)

(58) Field of Classification Search
CPC ....... G01N 15/1434; G01N 2015/1486; G01N 2015/1493; G01N 15/1459; G01N 15/0205; G01N 15/06; G01N 2015/0046; G01N 2015/0693; H01L 31/0203; H01L 31/02325; H01L 31/167
See application file for complete search history.

(56) References Cited

U.S. PATENT DOCUMENTS

| 8,441,368 B2 * | 5/2013 | Liess | G08B 17/107 340/693.6 |
| 2004/0042008 A1 | 3/2004 | Wagner et al. | |
| 2006/0038998 A1 | 2/2006 | Wagner | |
| 2008/0156093 A1 * | 7/2008 | Permuy | G01N 9/002 73/32 A |
| 2009/0279095 A1 * | 11/2009 | Mori | H04N 1/00058 356/445 |
| 2010/0309013 A1 | 12/2010 | Liess et al. | |

(Continued)

FOREIGN PATENT DOCUMENTS

| CN | 104833655 A | 8/2015 |
| JP | 11-330539 A | 11/1999 |

(Continued)

*Primary Examiner* — Kara E. Geisel
*Assistant Examiner* — Amanda Merlino
(74) *Attorney, Agent, or Firm* — ScienBiziP, P.C.

(57) ABSTRACT

[Object] To provide a particle detection sensor that is compact-and-flat designed and manufacturable at low cost. [Solution] A particle detection sensor (1) includes light transmissive resin (5) that encapsulates a light emitting element (3) and a light receiving element (6), and a reflective surface (7) that is arranged on the light transmissive resin (5) and reflects output light (8) radiated from the light emitting element (3) toward an incident light field area (10).

14 Claims, 19 Drawing Sheets

1: PARTICLE DETECTION SENSOR
2: SUBSTRATE
3: LIGHT EMITTING ELEMENT
4: WIRE
5: LIGHT TRANSMISSIVE RESIN
6: LIGHT RECEIVING ELEMENT
7: REFLECTIVE SURFACE
8: OUTPUT LIGHT
9: DISTURBANCE LIGHT
10: INCIDENT LIGHT FIELD AREA
11: PARTICLE
12: BEAM CONVERGENCE LOCATION
13: SCATTERED LIGHT

(56) References Cited

U.S. PATENT DOCUMENTS

| | | |
|---|---|---|
| 2011/0221889 A1 | 9/2011 | Knox et al. |
| 2012/0140231 A1 | 6/2012 | Knox et al. |
| 2015/0077860 A1 | 3/2015 | Pochy et al. |
| 2016/0313243 A1 | 10/2016 | Dittrich et al. |
| 2017/0299510 A1 | 10/2017 | Acikalin et al. |
| 2018/0039053 A1* | 2/2018 | Kremer .................. G01J 1/44 |

FOREIGN PATENT DOCUMENTS

| | | |
|---|---|---|
| JP | 2000-206033 A | 7/2000 |
| JP | 2004-85573 A | 3/2004 |
| JP | 3574354 B2 | 10/2004 |
| JP | 2006-5141 A | 1/2006 |
| JP | 2010-34189 A | 2/2010 |
| JP | 2016-224034 A | 12/2016 |
| JP | 2018-128905 A | 8/2018 |
| TW | 200921572 A | 5/2009 |
| WO | 2004/104959 A2 | 12/2004 |

\* cited by examiner

1: PARTICLE DETECTION SENSOR
2: SUBSTRATE
3: LIGHT EMITTING ELEMENT
4: WIRE
5: LIGHT TRANSMISSIVE RESIN
6: LIGHT RECEIVING ELEMENT
7: REFLECTIVE SURFACE
8: OUTPUT LIGHT
9: DISTURBANCE LIGHT
10: INCIDENT LIGHT FIELD AREA
11: PARTICLE
12: BEAM CONVERGENCE LOCATION
13: SCATTERED LIGHT

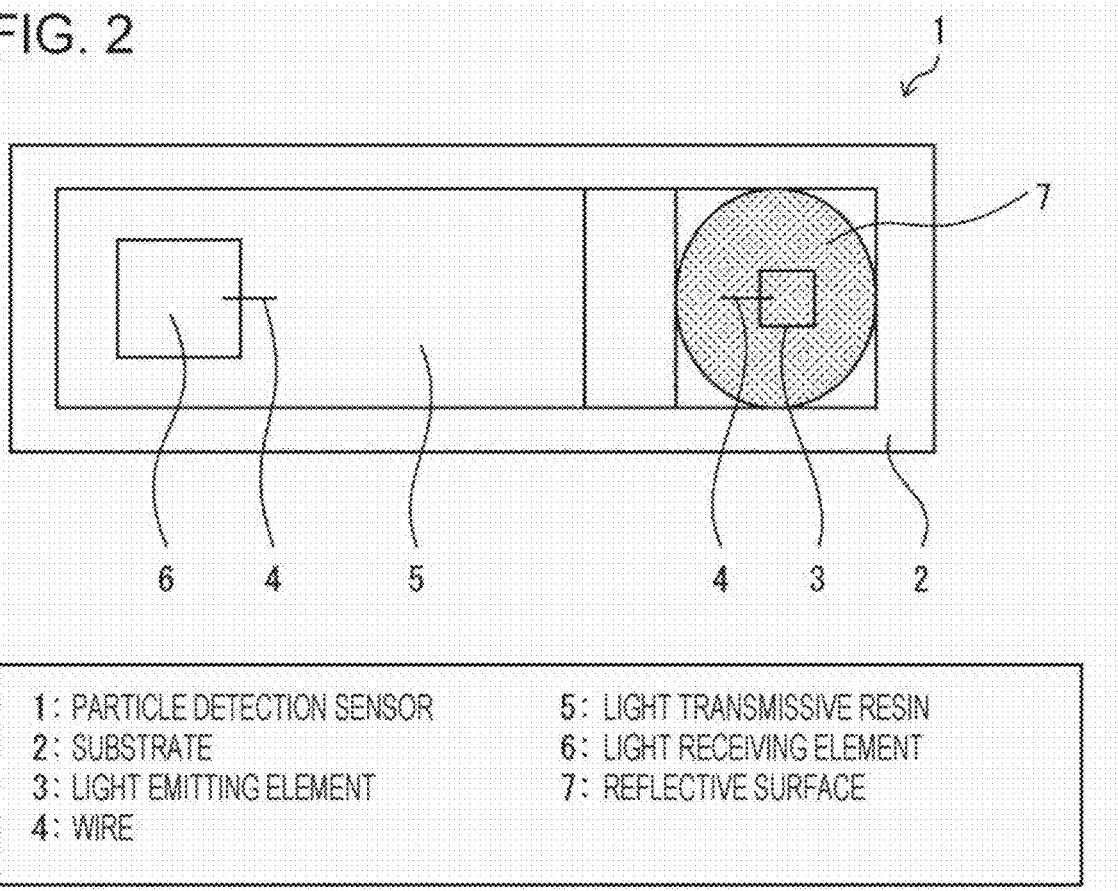
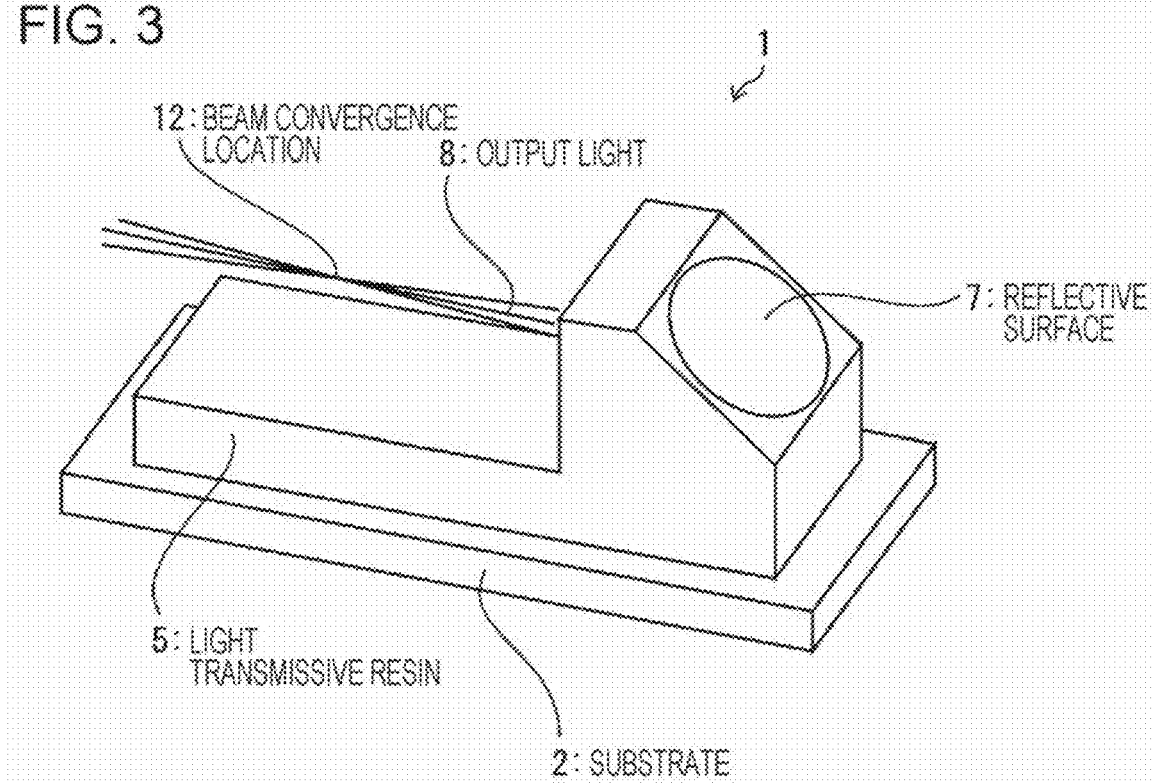

FIG. 4

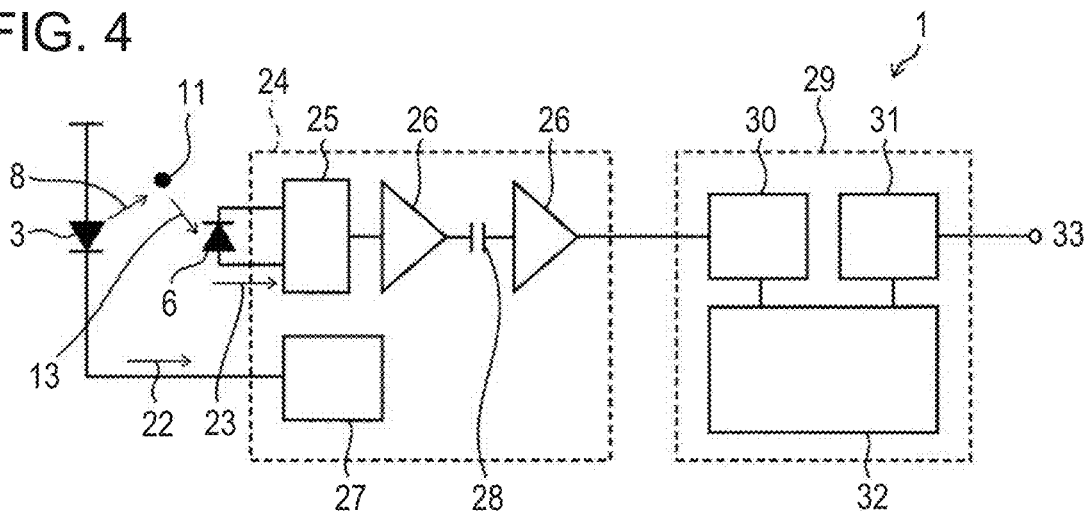

1: PARTICLE DETECTION SENSOR
3: LIGHT EMITTING ELEMENT
6: LIGHT RECEIVING ELEMENT
8: OUTPUT LIGHT
11: PARTICLE
13: SCATTERED LIGHT
22: LIGHT EMITTING ELEMENT DRIVING CURRENT
23: SIGNAL CURRENT
24: AMPLIFIER CIRCUIT UNIT
25: CURRENT-TO-VOLTAGE CONVERTER CIRCUIT
26: AMPLIFIER CIRCUIT UNIT
27: LIGHT EMITTING ELEMENT DRIVING CIRCUIT
28: COUPLING CAPACITOR
29: ARITHMETIC PROCESSOR
30: A/D CONVERTER CIRCUIT
31: SERIAL OUTPUT CIRCUIT
32: ARITHMETIC PROCESSING CIRCUIT
33: SERIAL OUTPUT

FIG. 5

OPERATION OF AVERAGE DENSITY METHOD

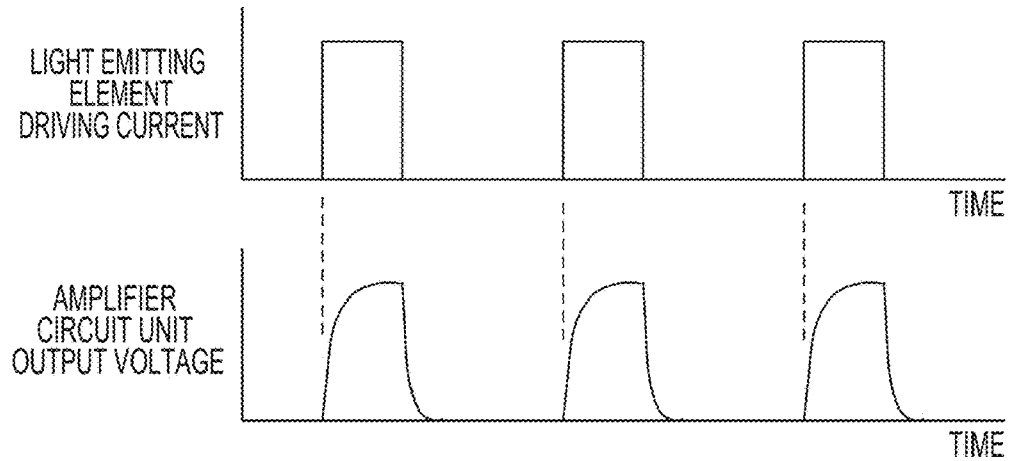

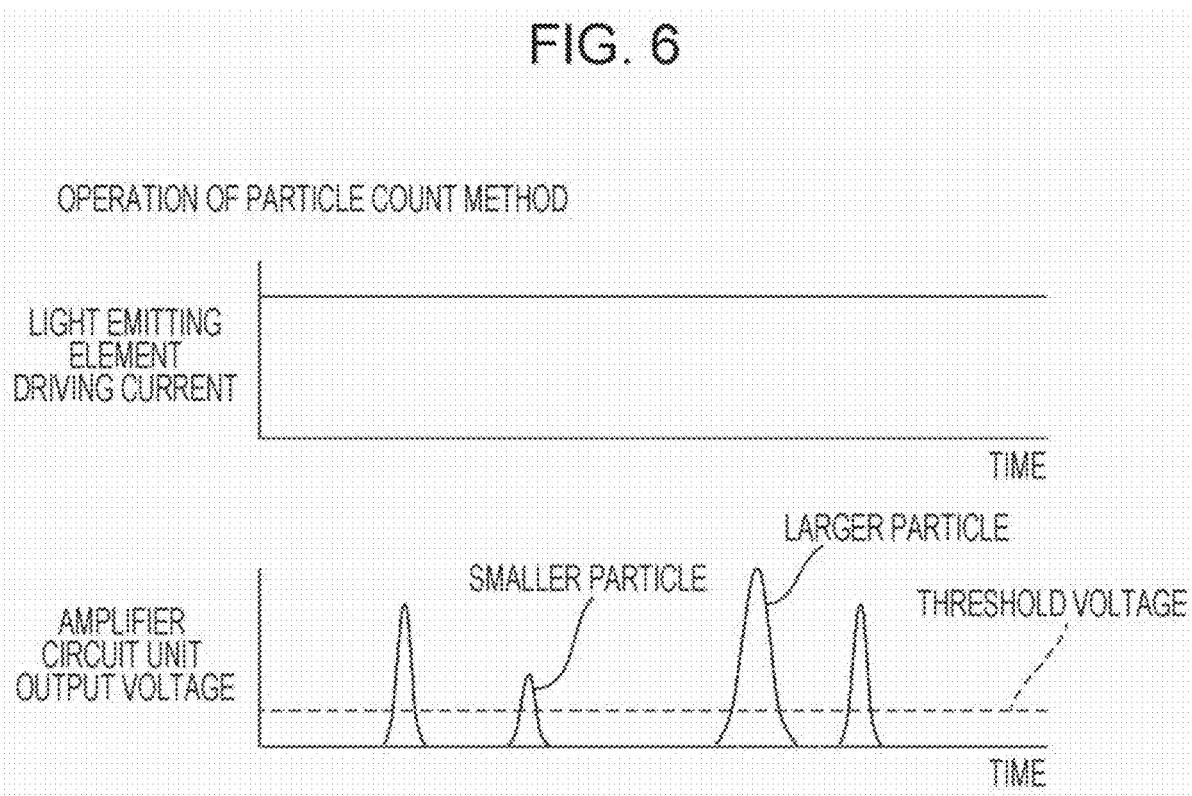

1d: PARTICLE DETECTION SENSOR
2: SUBSTRATE
3b: MULTIPLE LIGHT EMITTING ELEMENTS (VCSEL)
4: WIRE
5: LIGHT TRANSMISSIVE RESIN
6: LIGHT RECEIVING ELEMENT
7a: PLANE REFLECTIVE SURFACE
8d: OUTPUT LIGHT
9: DISTURBANCE LIGHT
10: INCIDENT LIGHT FIELD AREA
11: PARTICLE
13: SCATTERED LIGHT

1e: PARTICLE DETECTION SENSOR
2: SUBSTRATE
3: LIGHT EMITTING ELEMENT
4: WIRE
5: LIGHT TRANSMISSIVE RESIN
6: LIGHT RECEIVING ELEMENT
7: REFLECTIVE SURFACE
8: OUTPUT LIGHT
9: DISTURBANCE LIGHT
10: INCIDENT LIGHT FIELD AREA
11: PARTICLE
12: BEAM CONVERGENCE LOCATION
13: SCATTERED LIGHT
14: LIGHT RECEIVING LENS
15: VAPOR DEPOSITION SURFACE
16: STRAY LIGHT

1h: PARTICLE DETECTION SENSOR
2: SUBSTRATE
3: LIGHT EMITTING ELEMENT
4: WIRE
5a, 5b: LIGHT TRANSMISSIVE RESIN
6: LIGHT RECEIVING ELEMENT
7: REFLECTIVE SURFACE
8: OUTPUT LIGHT
9: DISTURBANCE LIGHT
10: INCIDENT LIGHT FIELD AREA
11: PARTICLE
12: BEAM CONVERGENCE LOCATION
13: SCATTERED LIGHT
17: LIGHT RECEIVING SURFACE
19: METAL SHIELD

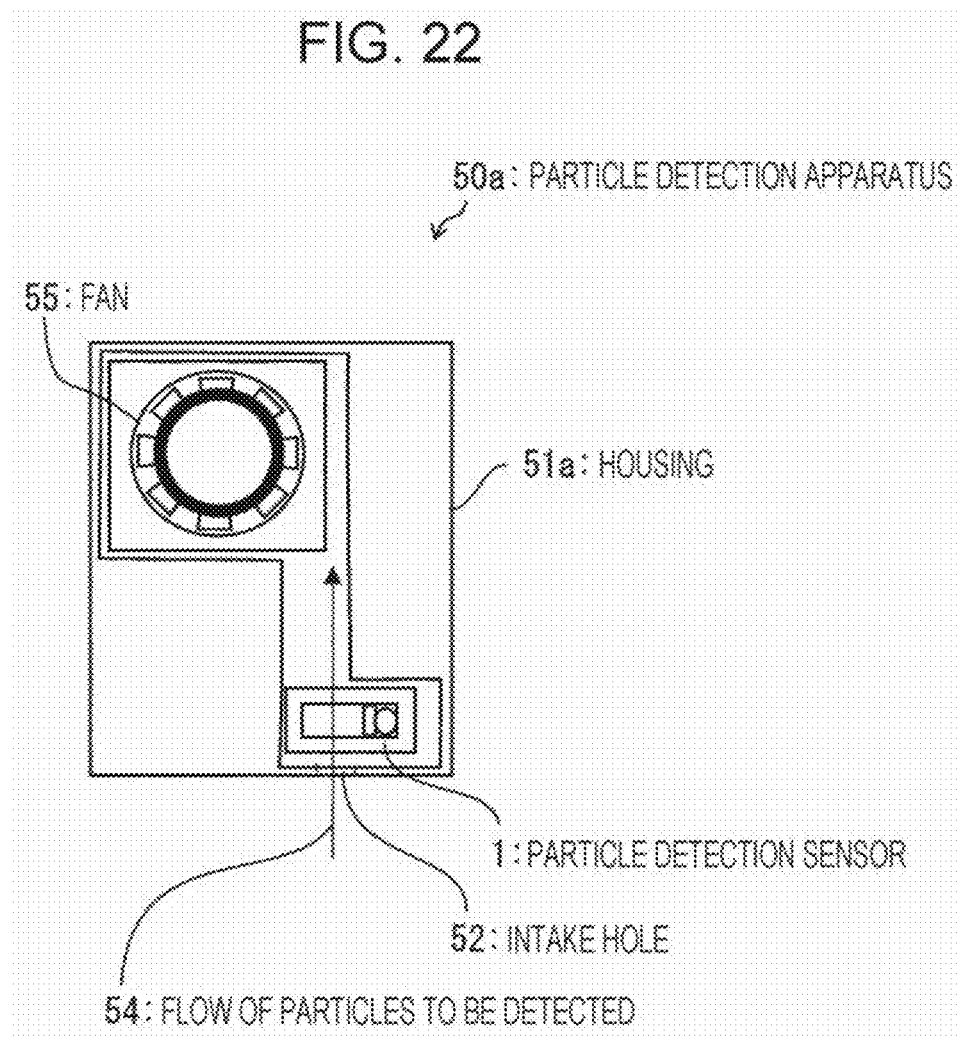

PARTICLE DETECTION SENSOR AND PARTICLE DETECTION APPARATUS

TECHNICAL FIELD

The present invention relates to a particle detection sensor and a particle detection apparatus detecting particles, such as dirt in air and cigarette smoke.

BACKGROUND ART

Particle detection sensors detect the presence or absence of particles by radiating output light (irradiation beam) from a light emitting element toward an incident light field area (detection region) of a light receiving element and by detecting with the light receiving unit scattered light caused when the output light impinges on the particles within the incident light field area. More in detail, the particle detection sensor detects the density of particles (uncleanness) or the type of particles with reference to an amount of scattered light (luminance) or detection frequency of the scattered light.

The particle detection sensors of related art employ detection methods that are generally divided into two types, namely, average density method and particle count method. In the average density method, a light emitting element is lit in a pulse, and an amount of particles is detected by detecting an amount of scattered light that is caused when light from the light emitting element impinges on particles within an incident light field area of a light receiving unit during a time period throughout which the light emitting element is lit. On the other hand, in the particle count method, a light emitting element is continuously lit, and an intensity and a frequency of occurrence of scattered light caused when particles pass across a beam of concentrated output light. A type and density of the particles are then detected.

The particle detection sensor based on the average density method is disclosed in Patent Literature 1. The particle detection sensor based on the particle count method is disclosed in Patent Literature 2.

These particle detection sensors involve detecting the scattered light that is caused when the output light impinges on the particles within the incident light field area of the light receiving unit and thus need to radiate the output light from the light emitting element to the incident light field area of the light receiving unit. For this reason, as disclosed in Patent Literature 3, the particle detection sensor of related art includes a housing separate from the light emitting element in order to guide the output light from the light emitting element to the incident light field area.

CITATION LIST

Patent Literature

[PTL 1] Japanese Patent No. 3574354
[PTL 2] Japanese Unexamined Patent Application Publication No. 2016-224034
[PTL 3] Japanese Unexamined Patent Application Publication No. 2018-128905

SUMMARY OF INVENTION

Technical Problem

As the use of particle detection sensors has become widespread, requests have arisen to detect a particle density at a variety of locations. In response to such a request, a compact design is desired of the particle detection sensor. The related art configuration including a housing is not advantageous in achieving the compact and flat design in the particle detection sensor. When the particle detection sensor is manufactured, a housing member needs to be used, leading to involving a mounting operation as an additional work step. This is not appropriate in view of low-cost design.

The present invention has been developed in view of the above-described problem and it is an object to provide a compact and flat designed particle detection sensor that is manufacturable at low cost.

Solution to Problem (1) The present invention in an aspect relates to a particle detection sensor that includes a light emitting element that outputs light, a light receiving element that detects scattered light when a particle within an incident light field area is irradiated with the output light, a light transmissive resin that encapsulates the light emitting element and the light receiving element, and a reflective surface that is formed on the light transmissive resin and reflects the output light radiated from the light emitting element toward to the incident light field area.

(2) The present invention in another aspect relates to the particle detection sensor according to the aspect (1), wherein a beam diameter of the output light radiated toward the incident light field area is equal to or smaller than a formation width of the formed reflective surface.

(3) The present invention relates in another aspect to the particle detection sensor according to the aspect (2), wherein the reflective surface reflects the output light toward the incident light field area while converging the beam diameter of the output light.

(4) The present invention relates in another aspect to the particle detection sensor according to one of the aspects (1) through (3), wherein an angle between a field direction of the incident light field area and an optical axis direction of the output light reflected from the reflective surface is approximately 90 degrees.

(5) The present invention relates in another aspect to the particle detection sensor according to one of the aspects (1) through (4), wherein a ratio of a full width at half a maximum of an intensity distribution of the output light reflected from the reflective surface to a width at an intensity of $1/e^2$ is larger than a ratio in a Gaussian distribution.

(6) The present invention relates in another aspect to the particle detection sensor according to one of the aspects (1) through (5), wherein the output light is infrared light, the light receiving element is sensitive an infrared wave region, and the light transmissive resin does not transmit visible light but transmits the infrared light.

(7) The present invention relates in another aspect to the particle detection sensor according to one of the aspects (1) through (6), wherein the light emitting element is VCSEL (Vertical Cavity Surface Emitting Laser).

(8) The present invention relates in another aspect to the particle detection sensor according to the aspect (7), wherein the reflective surface is plane.

(9) The present invention relates in another aspect to the particle detection sensor according to the aspect (8), wherein the light emitting element has a plurality of light emitting points that radiate the output light.

(10) The present invention relates in another aspect to the particle detection sensor according to one of the aspects (1) through (9), wherein metallic thin film is vapor-deposited on the reflective surface.

(11) The present invention relates in another aspect to the particle detection sensor according to one of the aspects (1) through (10), wherein a light receiving lens is mounted on the light transmissive resin within the incident light field area.

(12) The present invention relates in another aspect to the particle detection sensor according to one of the aspects (1) through (11), wherein the light emitting element and the light receiving element are respectively encapsulated in resins separated from each other.

(13) The present invention relates in another aspect to the particle detection sensor according to one of the aspects (1) through (12), wherein light shielding resin is applied in a portion excluding the incident light field area.

(14) The present invention relates in another aspect to the particle detection sensor according to one of the aspects (1) through (12), wherein a metal shield is arranged in a portion excluding the incident light field area.

(15) The present invention relates to a particle detection apparatus including the particle detection sensor according to one of the aspects (1) through (14), and a housing in which the particle detection sensor is arranged, wherein a fan that takes in the particle is arranged within the housing.

Advantageous Effects of Invention

According to the present invention, the particle detection sensor that implements a compact and flat design and is manufacturable at low cost is provided.

BRIEF DESCRIPTION OF DRAWINGS

FIG. 2 is a schematic view illustrating a top surface of the basic configuration of the particle detection sensor illustrated in FIG. 1.

FIG. 3 is a schematic perspective view illustrating the basic configuration of the particle detection sensor in FIG. 1.

FIG. 4 is a circuit diagram of the particle detection sensor in FIG. 1.

FIG. 5 illustrates an operation example of an average density method of the particle detection sensor in FIG. 4.

FIG. 6 illustrates an operation example of a particle count method of the particle detection sensor in FIG. 4.

FIG. 22 is a cross-sectional view of the particle detection apparatus in FIG. 21.

DESCRIPTION OF EMBODIMENTS

First Embodiment

Embodiments of the present invention are described in detail with reference to the drawings.
(Configuration Example of Particle Detection Sensor 1)

Figure 1:
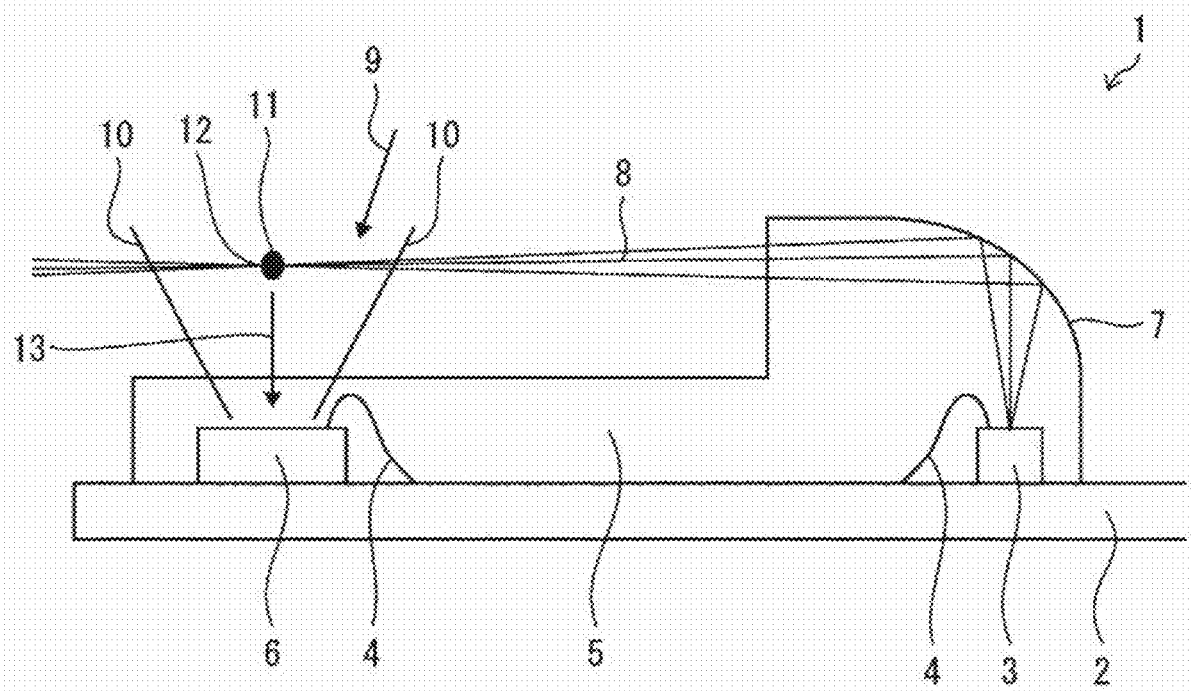
FIG. 1 is a schematic cross-sectional view of a basic configuration of a particle detection sensor of a first embodiment.

FIG. 1 is a schematic cross-sectional view of a basic configuration of a particle detection sensor 1 of a first embodiment. FIG. 2 is a schematic view illustrating a top surface of the basic configuration of the particle detection sensor 1 illustrated in FIG. 1. FIG. 3 is a schematic perspective view illustrating the basic configuration of the particle detection sensor 1 in FIG. 1.

In the particle detection sensor 1, a light emitting element 3 and a light receiving element 6 are die-bonded onto the same substrate 2 and are electrically connected to the substrate 2 via wire bonding. The light receiving element 6 and a light emitting element 3 are encapsulated in a single light transmissive resin 5. A reflective surface 7 is formed on an outer surface of the light transmissive resin 5 and faces in a direction in which output light 8 is radiated from the light emitting element 3. The reflective surface 7 reflects the output light 8 toward an incident light field area (detection region) 10 of the light receiving element 6.

The reflective surface 7 serves as the outer surface of the light transmissive resin 5 and has desirably a curved surface as illustrated in FIG. 3 such that the output light 8 is converged at a beam convergence location 12. Referring to FIG. 1, the output light 8 of the light emitting element 3 is reflected from the reflective surface 7 and converged in beam diameter within the incident light field area 10 of the light receiving element 6. When a particle 11 passes across the beam, scattered light 13 from the particle 11 enters the light receiving element 6 and a particle detection sensor 1 outputs a detection signal responsive to the scattered light 13. The operation of the particle detection sensor 1 is described later.

In this configuration, the output light 8 from the light emitting element 3 is guided to the incident light field area 10 in a manner free from the separate arrangement of a housing and a lens as in the related art. When the light emitting element 3 and the light receiving element 6 are resin-encapsulated in the light transmissive resin 5, an optical structure is defined at the same time.

Since this arrangement is free from the housing that is needed in the particle detection sensor of the related art, the compact and flat design is incorporated in the particle detection sensor 1. Since this arrangement is also free from the mounting of the housing, materials are reduced and a mounting operation to mount the materials is eliminated. For this reason, a lower-cost particle detection sensor 1 is thus implemented.

In the configuration, the output light 8 from the light emitting element 3 is reflected from the reflective surface 7 and the output light 8 that is converged in beam diameter is radiated onto the incident light field area 10 of the light receiving element 6. At this phase, the width of the output light 8 radiated onto the incident light field area 10 is desirably not in excess of a formation width of the reflective surface 7. This eliminates the need for the output light 8 to detect the particle 11 in a space above the particle detection sensor 1 (namely, above the top surface of the light transmissive resin 5). For this reason, a flat design is incorporated in the particle detection sensor 1.

Since the output light 8 is guided to be close to the receiving surface of the light receiving element 6 within the incident light field area 10 of the light receiving element 6, the intensity of the scattered light 13 incident on the light receiving element 6 is increased. The particle detection sensor 1 capable of detecting a more stable signal is thus implemented.

In accordance with the configuration, the scattered light 13 is appropriately caused within the incident light field area 10 of the light receiving element 6 by making to be approximately 90 degrees an angle between the field direction of the incident light field area 10 of the light receiving element 6 and the optical axis of the output light 8 reflected from the reflective surface 7. Even if any housing to guide the scattered light 13 is not included, the scattered light 13 is appropriately detected and a lower-cost the particle detection sensor 1 is thus implemented.

Since the light emitting element 3 is outside the incident light field area 10 of the light receiving element 6, the output light 8 from the light emitting element 3 is stopped from directly entering the light receiving element 6. This eliminates shot noise that may be caused by the output light 8 that directly enters the light receiving element 6. In this configuration, the detection of the particle 11 may be stabler at an increased S/N ratio.

If the wavelength of the light emitting element 3 is in the visible light region, the light transmissive resin 5 is desirably transparent. However, in this case, there is a possibility of an erratic detection if illumination light or disturbance light in the visible light region of the sunlight enters the incident light field area 10 of the light receiving element 6. For this reason, the wavelength of the light emitting element 3 is set to be in the infrared region and the light transmissive resin 5 is of a type that does not transmit visible light but transmit infrared light. This attenuates in the incident light level the indoor illumination light or disturbance light in the visible light region of the sunlight entering the light receiving element 6. The particle detection sensor 1 being free from the effect of the disturbance light and providing stable output and is thus implemented.

(Basic Operation of the Particle Detection Sensor 1)

Described below are the circuit configuration of the particle detection sensor 1, the operation of the particle detection sensor 1 of the average density method, and the operation of the particle detection sensor 1 of the particle count method.

FIG. 4 is a circuit diagram of the particle detection sensor 1. The light emitting element 3 is connected to the light emitting element driving circuit 27 and emits light in response to a current generated by the light emitting element driving circuit 27. The output light 8 of the light emitting element 3 is guided to the detection field region of the light receiving element 6. If the particles 11 is present there, the scattered light 13 enters the light receiving element 6.

The scattered light 13 having entered the light receiving element 6 becomes a signal current 23. The signal current 23 is converted into a voltage by the current-to-voltage converter circuit 25 connected to the light receiving element 6, and the voltage is amplified through an amplifier circuit unit 26, coupling capacitor 28, and amplifier circuit unit 26 connected as subsequent stages. The amplified voltage is then input to an arithmetic processor 29.

In the arithmetic processor 29, the scattered light 13 in the form of voltage is A/D converted by a A/D converter circuit 30, the A/D converted signal is arithmetically processed by the arithmetic processing circuit 32, the processed signal is then converted into a serial signal by a serial output circuit 31, and the serial signal is output as an output of the particle detection sensor 1.

(Operation of the Particle Detection Sensor 1 of the Average Density Method)

FIG. 5 illustrates an operation example of an average density method of the particle detection sensor 1. Illustrated in the top portion of FIG. 5 is the time-series change of a driving current of the light emitting element 3. Illustrated in the bottom of FIG. 6 is an example of an output voltage of an amplifier circuit unit.

Referring to the top portion of FIG. 5, the light emitting element 3 is pulse-driven in the average density method. The scattered light 13 from the particle 11 is incident on the light receiving element 6 only during a time period throughout which the light emitting element 3 emits light. The voltage responsive to the scattered light 13 is amplified through the amplifier circuit unit 26, resulting in the waveform illustrated in the bottom portion of FIG. 5.

The output voltage of the amplifier circuit unit 26 is proportional to the scattered light 13. Specifically, the output voltage varies in proportion to the density of the particles 11. The output voltage of the amplifier circuit unit 26 is A/D converted by the A/D converter circuit 30 in the arithmetic processor 29 at a timing in synchronization with a drive timing of the light emitting element 3, the A/D converted voltage is arithmetically processed, and the resulting signal is output as the serial signal.

In the average density method, the scattered light 13 is received at the light emission timing of the light emitting element 3. In this case, if the abundance ratio of the particles 11 in a space is lower, the particle count varies depending on the light emission timing and the output voltage varies. The output may thus possibly be unstable. To reduce the variations, the output light 8 of the light emitting element 3 is desirably radiated in a wider area within the incident light field area 10 of the light receiving element 6 such that the scattered light 13 receives more particles 11.

(Operation of the Particle Detection Sensor 1 in the Particle Count Method)

FIG. 6 illustrates an operation example of the particle count method of the particle detection sensor 1. Illustrated in the top portion of FIG. 6 is the time-series change of a driving current of the light emitting element 3. Illustrated in the bottom of FIG. 6 is an example of the output voltage of the amplifier circuit unit 26.

Referring to the top portion of FIG. 6, the light emitting element 3 is continuously lit in the particle count method. The scattered light 13 is incident on the light receiving element 6 when the particles 11 pass across the beam of the output light 8 of the scattered light 13. The voltage responsive to the scattered light 13 is amplified through the amplifier circuit unit 26, leading to the waveform illustrated in the bottom portion of FIG. 6.

The output voltage of the amplifier circuit unit 26 is periodically A/D converted by the A/D converter circuit 30 connected as a later stage. When the A/D converted signal above a predetermined threshold voltage comes in, it is determined that the particles 11 have passed. The arithmetic processor 29 counts the number of particles per unit time and outputs results as a count or density. It is also possible that the size of the particle 11 having passed is detected by referring to the magnitude of the peak of the output voltage (peak value) of the amplifier circuit unit 26.

Referring to FIG. 6, the peak of the output voltage increases when a larger particle has passed across and the peak of the output voltage decreases when a smaller particle has passed across. The density of particles is found on a per particle size basis in accordance with these pieces of information and has thus a higher accuracy level.

In the particle count method, the scattered light 13 of a single particles 11 passing across the output light 8 of the light emitting element 3 is detected. The output light 8 of the light emitting element 3 is desirably converged to a smaller diameter beam within the incident light field area 10 of the receiving element 6 such that the scattered light 13 is enlarged and stably detected and such that miscounting of particles that may occur with multiple particles 11 having passed across the beam of the output light 8 of the light emitting element 3 is reduced. Since this arrangement increases an intensity per unit volume of the particle 11, simultaneous detection of multiple particles 11 is controlled.

In this configuration, the beam intensity distribution may be optimized in the particle count method when a light beam is formed by reflecting the output light 8. Specifically, means is used to derive a beam of an intensity distribution having a central constant intensity portion (a region of a flat beam intensity) with narrower skirt portions on both sides of the central constant intensity portion from an intensity distribution of a typical Gaussian distribution having broad skirt portions (the means is hereinafter referred to as beam intensity distribution flattening means).

The means is implemented by optically optimizing the shape of the reflective surface 7. The advantage achieved by flattening the beam intensity distribution is described with reference to FIGS. 7 and 8.

Figure 7:
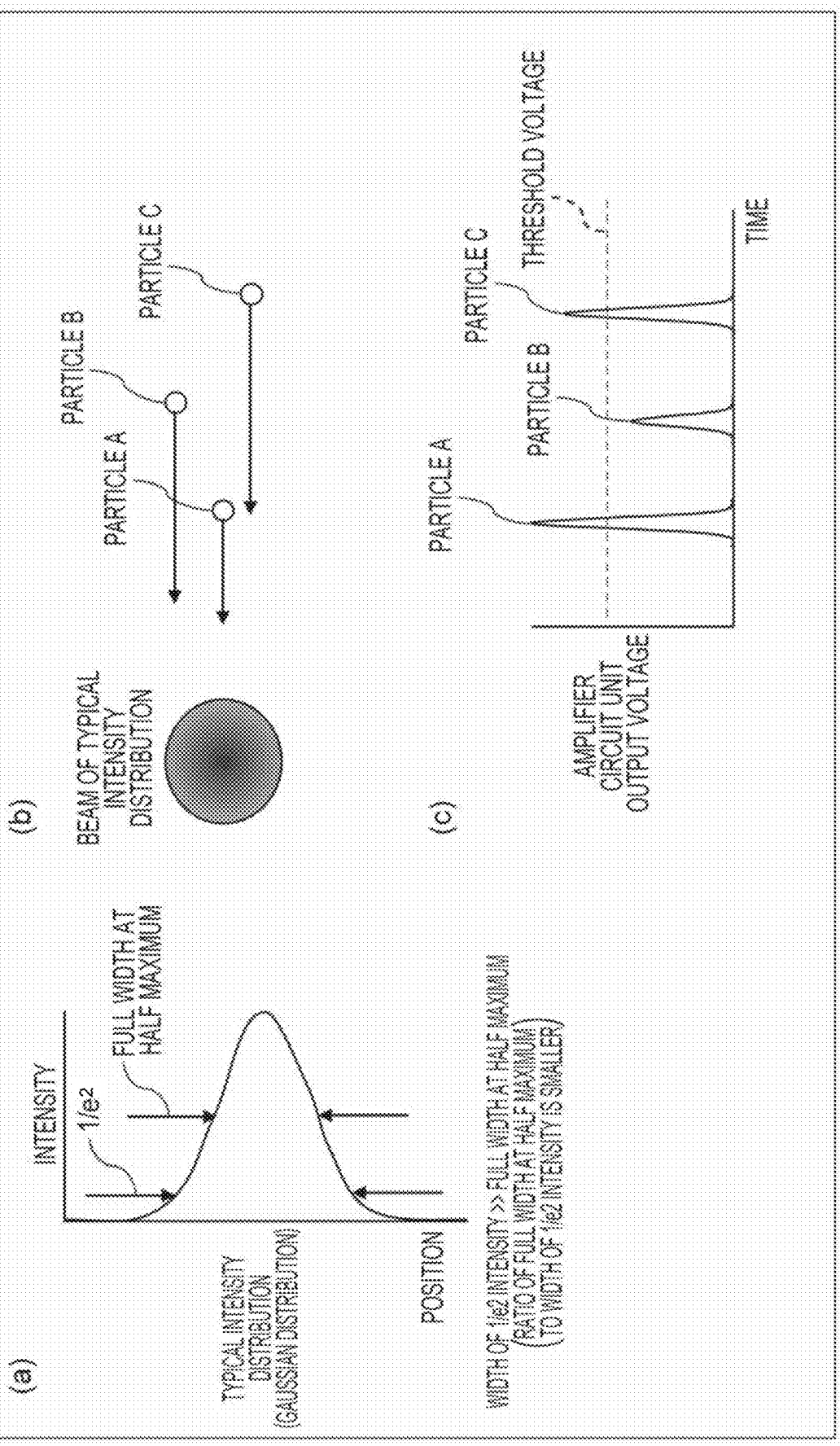
FIG. 7 illustrates an operation example of output light in which a beam intensity distribution of the output light is a typical Gaussian distribution.
Figure 8:
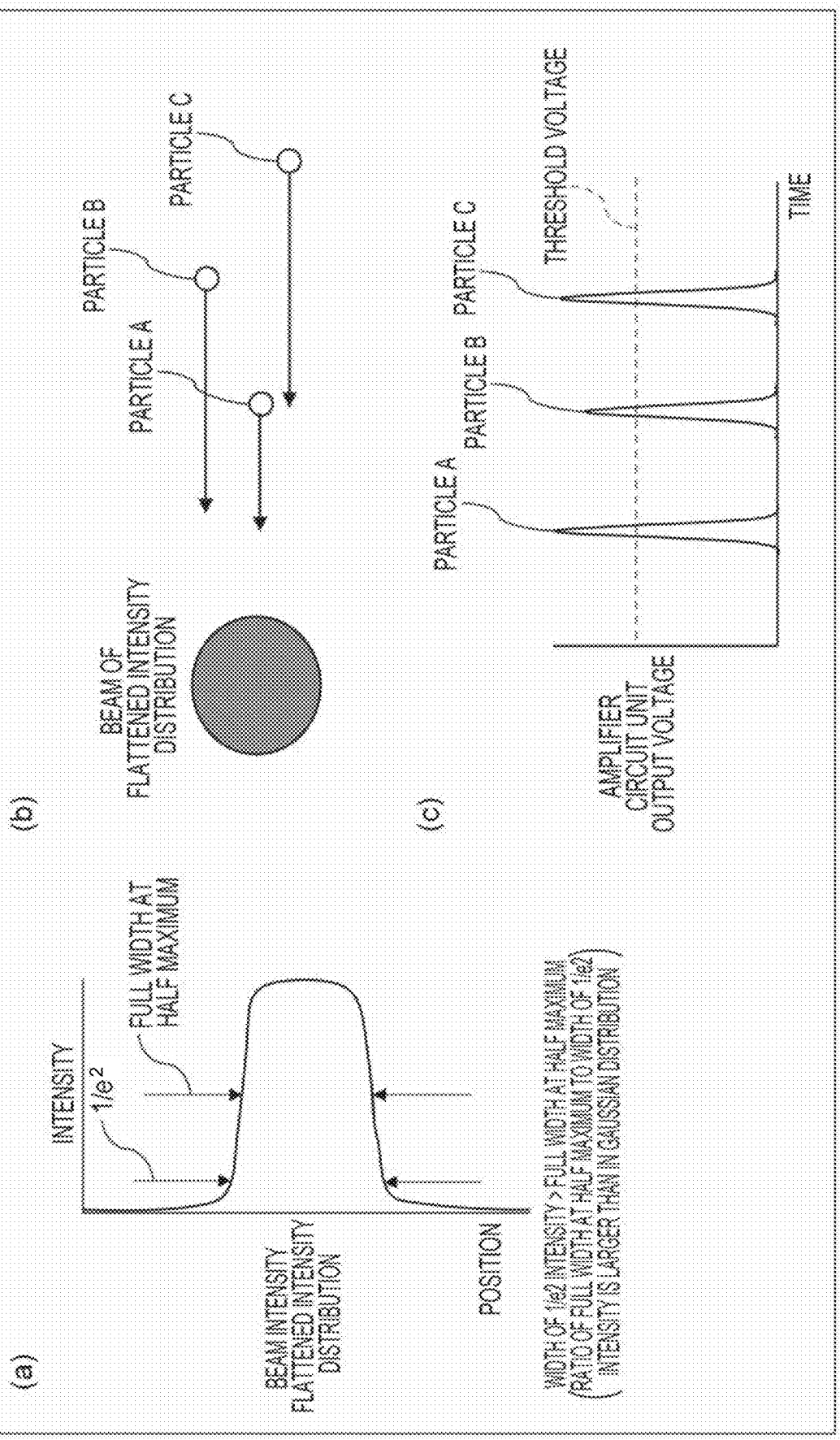
FIG. 8 illustrates an operation example of the output light in which the beam intensity distribution of the output light is flattened.

FIG. 7 illustrates an operation example when the intensity distribution of the beam of the light emitting element 3 is a typical Gaussian distribution. FIG. 8 illustrates an operation example when the beam of the light emitting element 3 is formed through a beam intensity distribution flattening function of the configuration.

FIG. 7(a) and FIG. 8(a) illustrate the beam intensity distributions, FIG. 7(b) and FIG. 8(b) illustrate how particles A, B, and C pass across the beam, and FIG. 7(c) and FIG. 8(c) illustrate output waveforms that are generated in the output of the amplifier circuit when the particles pass across the beam.

FIG. 7(a) illustrates the typical Gaussian distribution. The Gaussian distribution has a shape having a peak intensity and skirt portions with intensity decreasing on both sides of the peak intensity. If a full width at half the maximum of the distribution is compared with a width at $1/e^2$ intensity, the width at $1/e^2$ intensity is larger. In other words, the ratio of the full width at half the maximum to the width at $1/e^2$ intensity is smaller.

When the particles A, B, and C sequentially pass across the beam as illustrated in FIG. 7(b), a signal in FIG. 7(c) is generated in the output of the amplifier circuit unit.

When the particles A, B, and C sequentially pass across the beam having the typical intensity distribution, the resulting signal varies in magnitude in accordance with the passage location of the particle even though the particles of the same size pass across the beam. For example, if a threshold voltage is set up as illustrated in FIG. 7(c), the pass of the particle B is not counted. If the intensity distribution of the beam is deviated, such a problem is created.

FIG. 8(a) illustrates the intensity distribution of the beam when the intensity distribution of the configuration is flattened. The distribution has a constant intensity portion at the peak of the distribution and narrower skirt portions on both sides. The difference between the full width at half the maximum and the width at $1/e^2$ intensity becomes smaller and the ratio of the full width at half the maximum to the width at $1/e^2$ intensity is larger than that in the Gaussian distribution.

FIG. 8(c) illustrates the output waveform. The output signals are uniform in intensity in comparison with the typical beam intensity distribution in FIG. 7 and the pass of the particle B is thus properly counted.

The use of the beam intensity distribution flattening means in this configuration controls instability caused by the intensity distribution of the beam. The particle detection sensor 1 capable of stable detection is thus provided.

Modifications 1 and 2

The embodiment described above provides the configuration appropriate for the particle count method. Specifically, the configuration is provided by converging the beam diameter to be as small as possible within the incident light field area 10 of the light receiving element 6. The configuration appropriate for the average density method may be easily optimized by modifying the shape of the reflective surface 7 such that the output light 8 of the light emitting element 3 is radiated in a wider area within the incident light field area 10 of the light receiving element 6.

Figure 9:
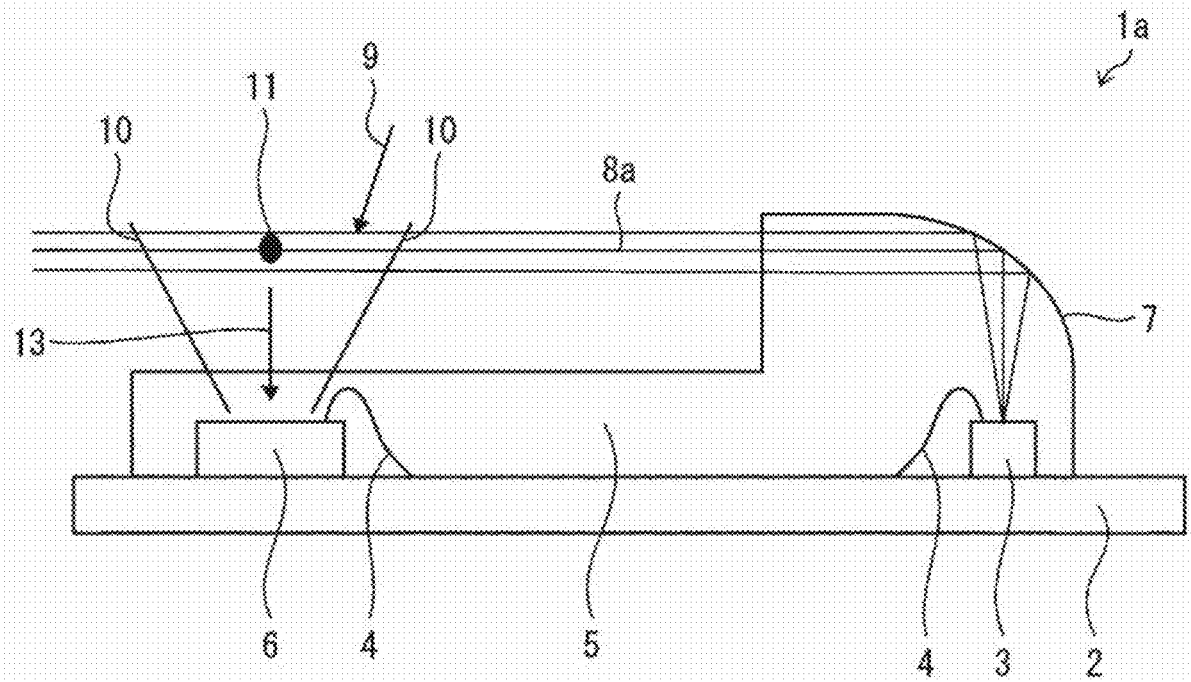
FIG. 9 is a schematic cross-sectional view of the basic configuration of a modification 1 of the particle detection sensor.
Figure 10:
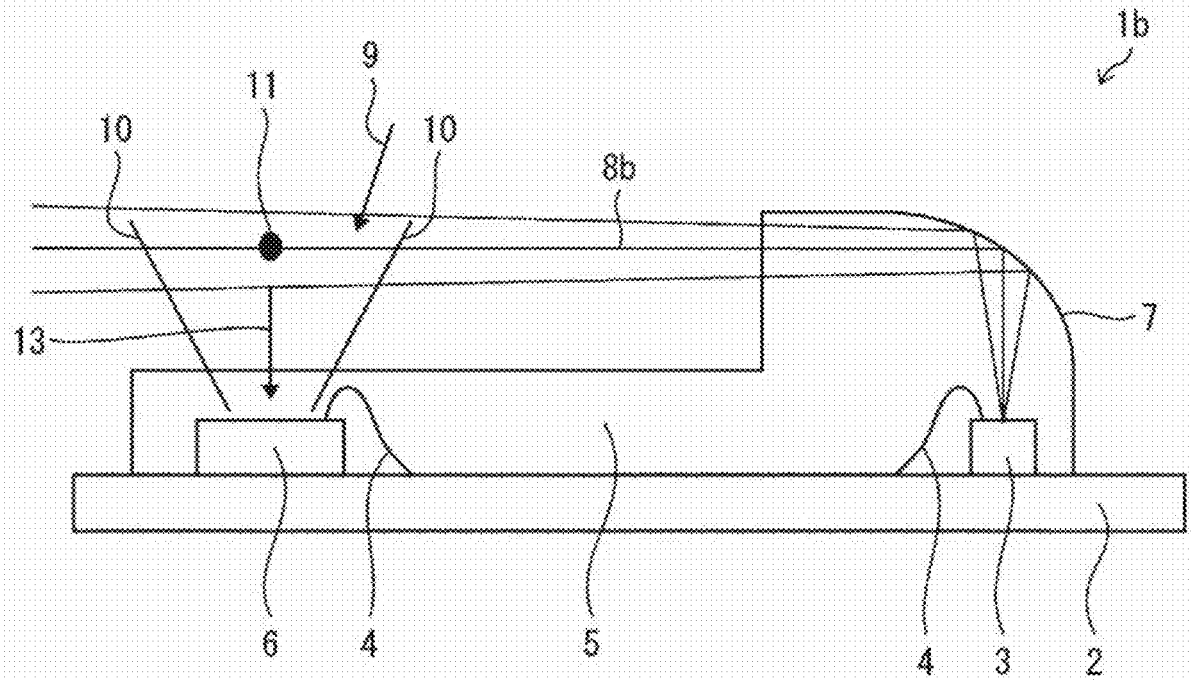
FIG. 10 is a schematic cross-sectional view of the basic configuration of a modification 2 of the particle detection sensor.

FIG. 9 schematically illustrates the configuration of a particle detection sensor 1a (modification 1) when the reflective surface 7 sets the output light 8a to be parallel such that the output light 8 of the light emitting element 3 is radiated widely within the incident light field area 10 of the light receiving element 6. FIG. 10 schematically illustrates the configuration of a particle detection sensor 1b (modification 2) when the reflective surface 7 moderately widens the output light 8b to within a detection region of the light receiving element 6 such that the output light 8 of the light emitting element 3 is radiated even more widely.

The modification provides the configuration in which the reflective surface 7 makes the output light 8a parallel or the configuration in which the reflective surface 7 moderately widens the output light 8b to within the detection region of the light receiving element 6. The particle detection sensor 1a or 1b also appropriate for the average density method is easily implemented.

Modification 3

The light emitting element 3 may be LED (light emitting diode) or VCSEL. As described above with reference to the embodiment, the output light 8 output from the light emitting element 3 needs to be converged more in beam diameter and increased in intensity in order to optimize the configuration for the particle count method.

Figure 11:
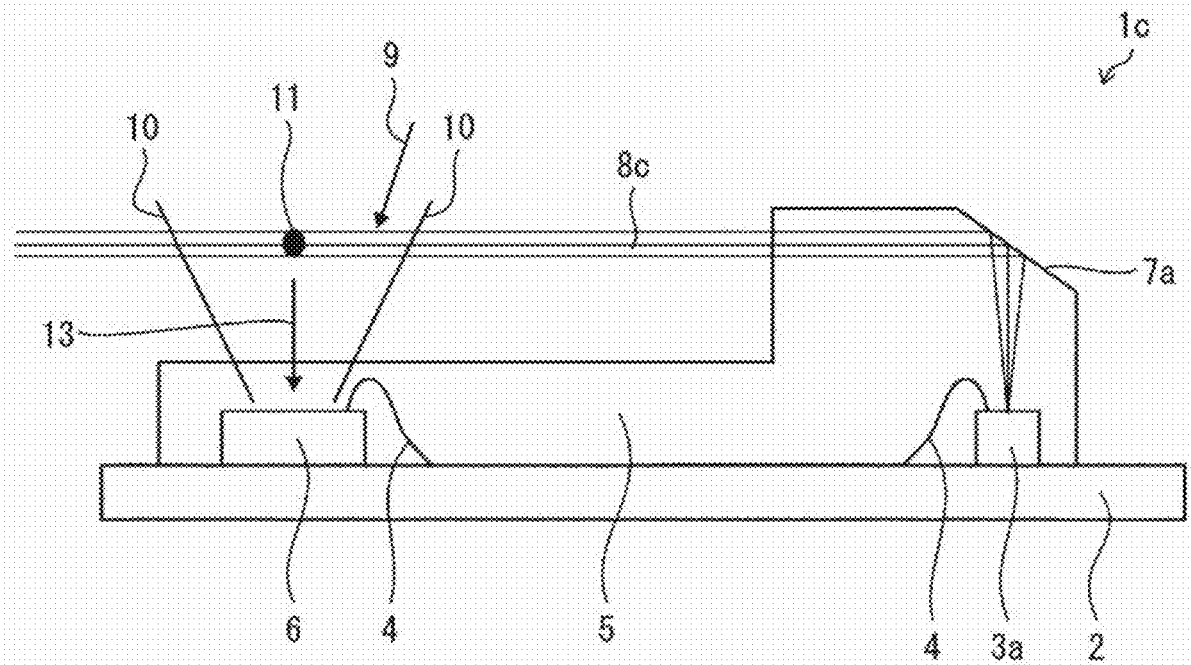
FIG. 11 is a schematic cross-sectional view of the basic configuration of a modification 3 of the particle detection sensor.

FIG. 11 is a conceptual diagram of the configuration of a particle detection sensor 1c when the light emitting element 3a is VCSEL. For VCSEL, an output angle may be converged more. For this reason, the reflective surface 7 is free from converging the beam diameter of output light 8c and is thus free a complex configuration such as a toroidal surface. A plane reflective surface 7a that is an easily formed surface is simply arranged on the light transmissive resin 5. The particle detection sensor 1c is thus easily produced.

In comparison with LED, VCSEL has typically light emission power higher than LED and achieves a smaller output angle, thereby converging a beam to a smaller diameter. Since the output intensity per unit volume is increased in comparison with LED, the light emitting element 3a is desirably VCSEL. The intensity of the scattered light 13 from the particles 11 is thus increased and the particle detection sensor 1c providing stable output is thus implemented.

Modification 4

Figure 12:
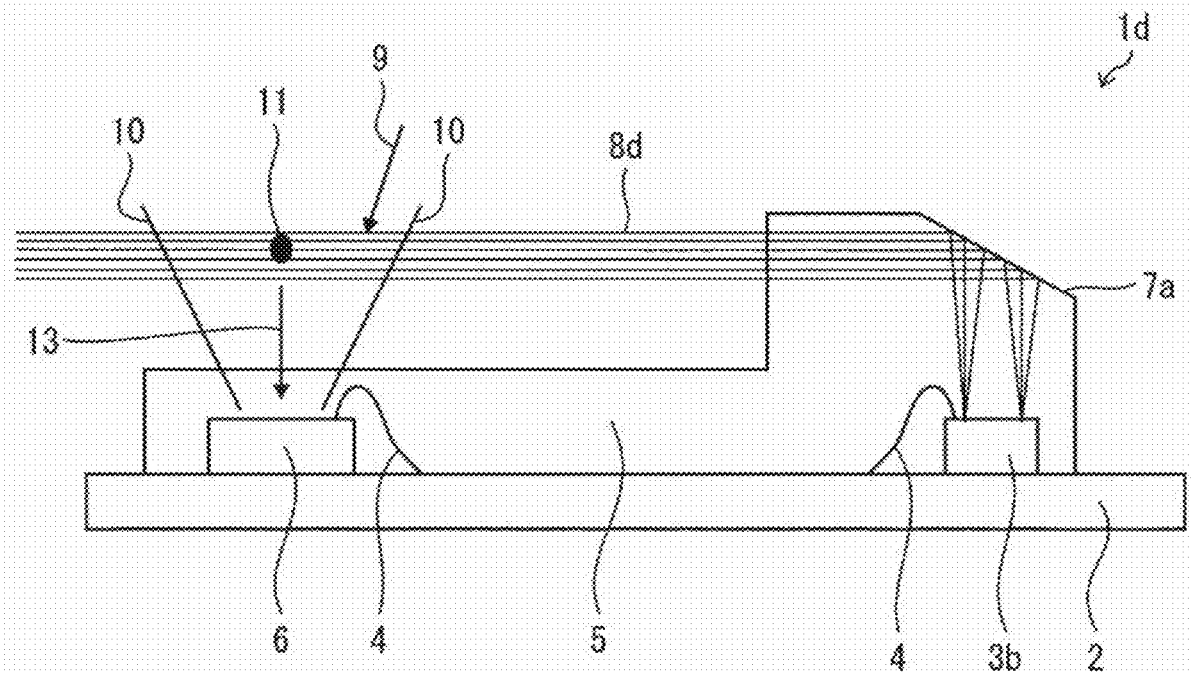
FIG. 12 is a schematic cross-sectional view of the basic configuration of a modification 4 of the particle detection sensor.

FIG. 12 is a conceptual diagram of the configuration in which a light emitting element 3b as VCSEL has multiple light emitting points. Since VCSEL has a smaller output angle as described above, the reflective surface 7a may be plane. If the light emitting element 3b having multiple emitting points is used with the plane reflective surface 7a, multiple beams of output light 8d may be easily radiated to the incident light field area 10.

By using the multiple beams of the output light 8d radiated to the incident light field area 10, the output count of signal is increased. A particle detection sensor 1d capable of stabler detection is thus implemented.

Figure 13:
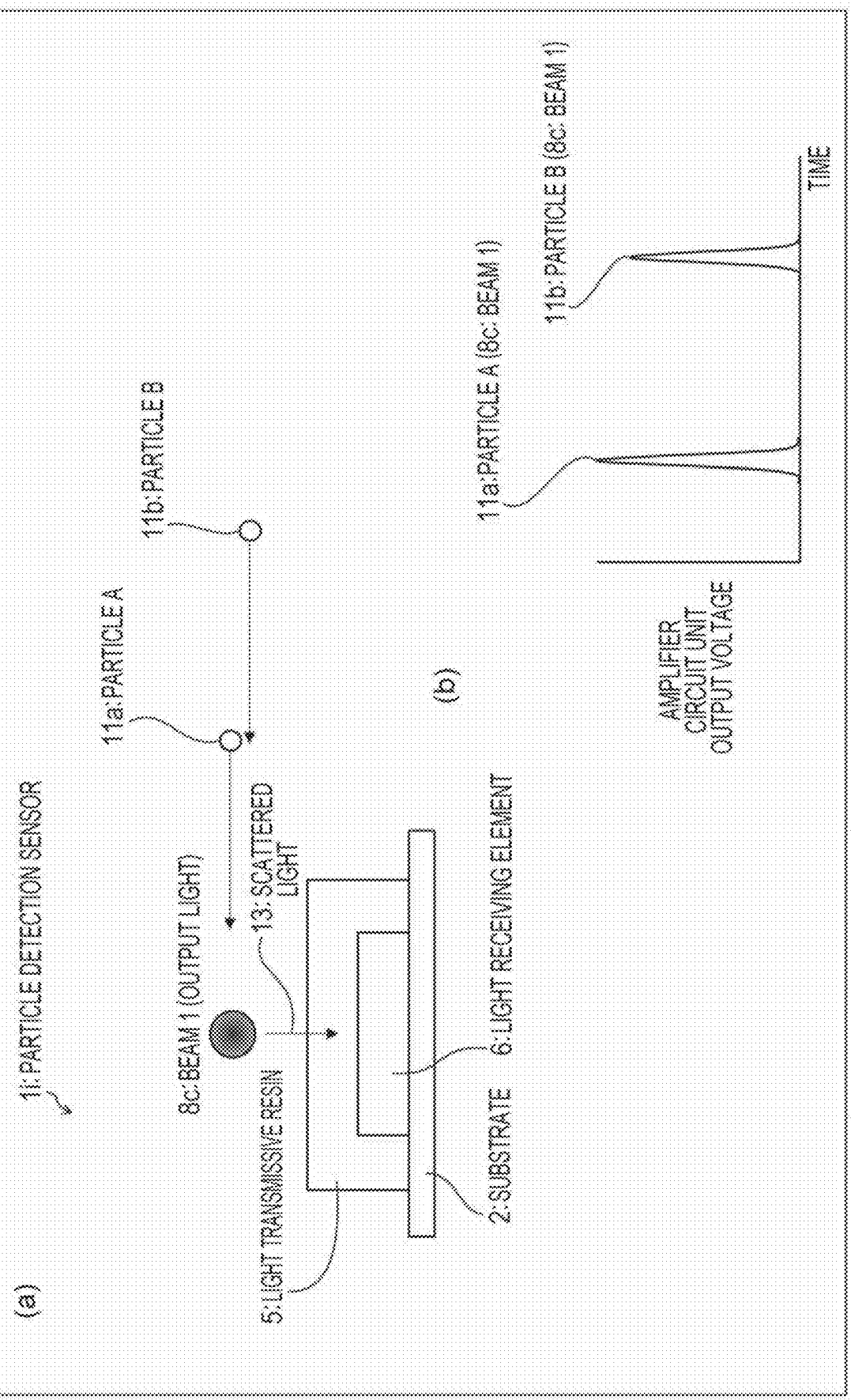
FIG. 13 illustrates an operation example when one output light beam is used.
Figure 14:
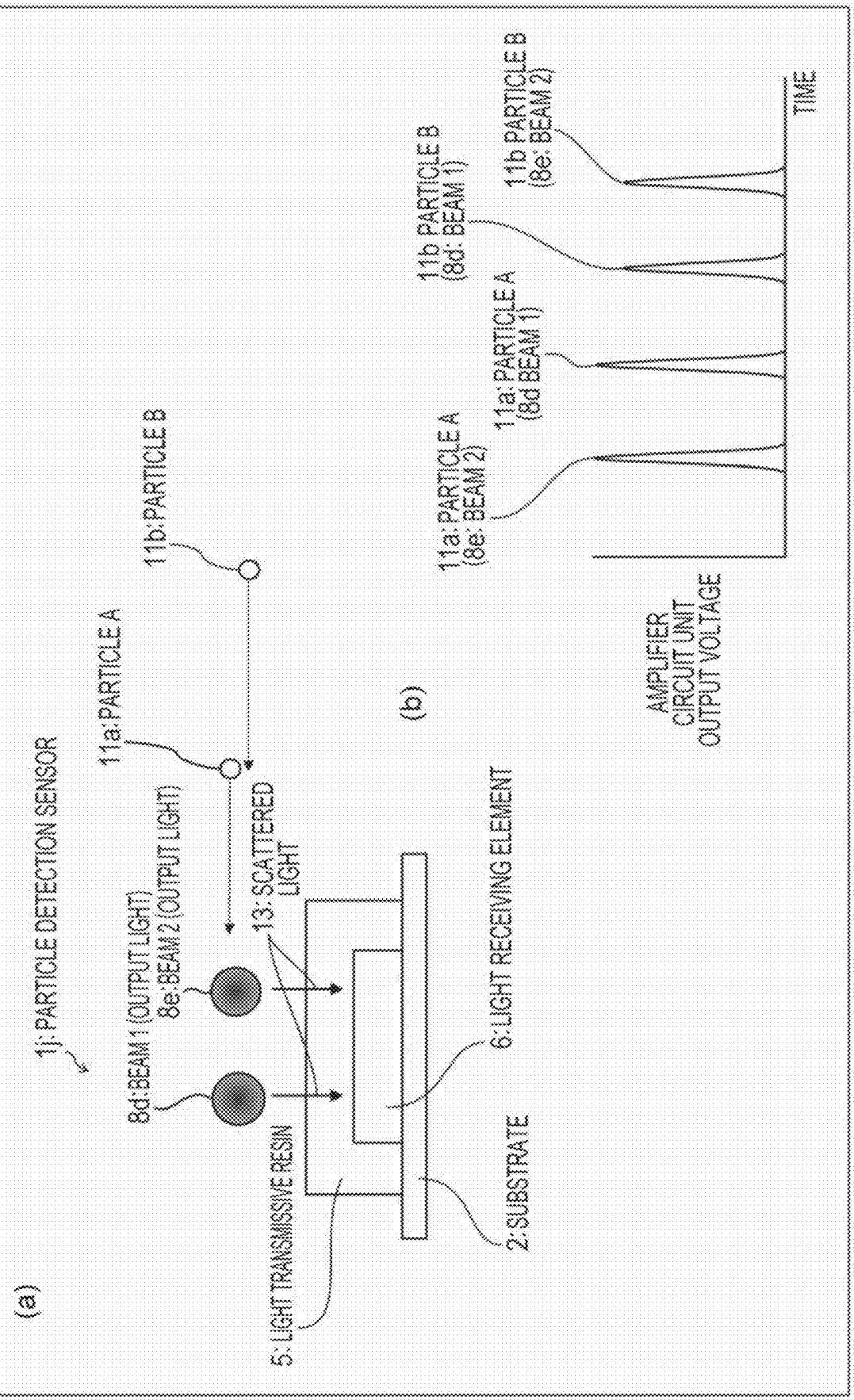
FIG. 14 illustrates an operation example when two output light beams are used.

The advantage of using the multiple beams of the output light 8d (hereinafter also simply referred to as beam) is described below. FIG. 13 illustrates an operation when a single beam is used, and FIG. 14 illustrates an operation when two beams are used. FIG. 13(*a*) and FIG. 14(*a*) illustrate how the particles 11 passing across the beam and FIG. 13(*b*) and FIG. 14(*b*) illustrate output signals of the amplifier circuit unit 26 in respective operations.

A comparison of FIG. 13(*b*) to FIG. 14(*b*) reveals that the use of multiple beams increases the number of output signals of the amplifier circuit unit 26. In this way, the particle detection sensor 1d capable of stable detection is implemented.

Modification 5

A metallic thin film is vapor-deposited on the reflective surface 7 of the embodiment to form the vapor deposition surface 15. Reflectance of the reflective surface 7 is thus increased. The intensity of the scattered light 13 of the particles 11 is also increased. A particle detection sensor 1e providing stable output is thus implemented.

Figure 15:
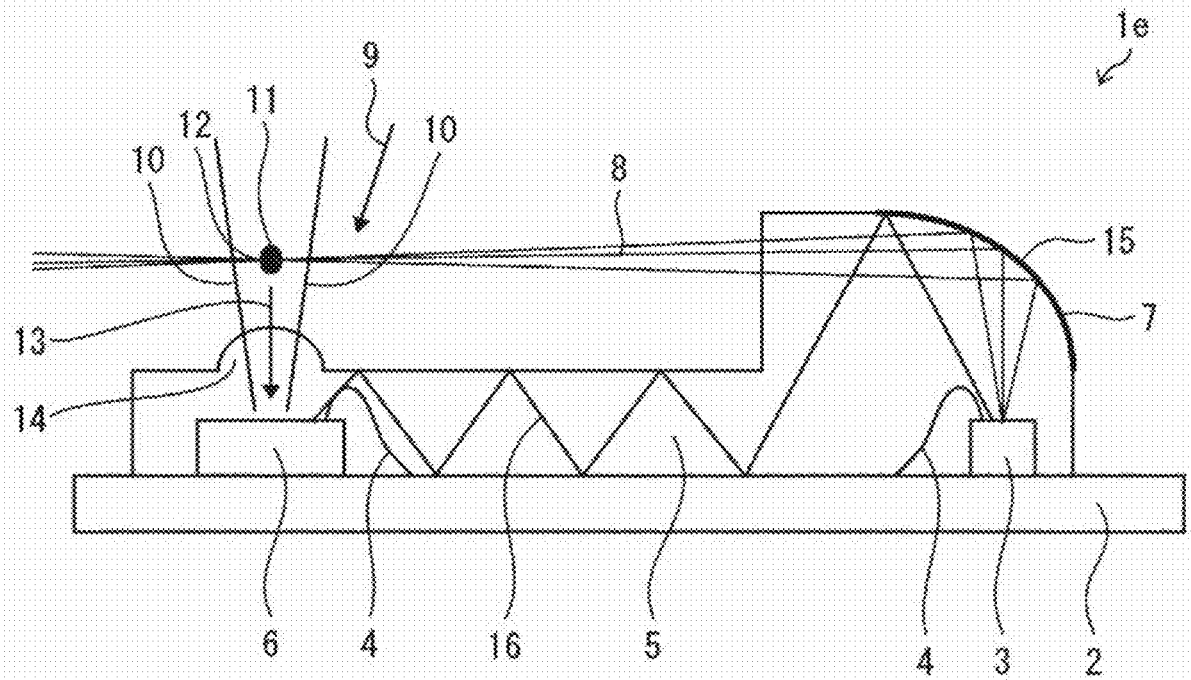
FIG. 15 is a schematic cross-sectional view of the basic configuration of a modification 5 of the particle detection sensor.

FIG. 15 schematically illustrates the cross-section of the basic configuration of the particle detection sensor 1e. The particle detection sensor 1e includes a light receiving lens 14 that is on the light transmissive resin 5 within the incident light field area 10 of the light receiving element 6 and receives the scattered light 13 from the particle 11.

The scattered light 13 from the particle 11 is efficiently collected by arranging the light receiving lens 14. Since signal intensity thus increases, the particle detection sensor 1e providing stable output is implemented. Since a light receiving lens separate from the light receiving element 6 is not needed, the compact and flat designed particle detection sensor 1e is implemented. Since the particle detection sensor 1e is free from mounting the light receiving lens at the manufacturing phase, the particle detection sensor 1e is manufactured at a lower cost.

Modification 6

When the light receiving element 6 and the light emitting element 3 are encapsulated, the light receiving element 6 and the light receiving element 6 may be encapsulated in separate light transmissive resins 5.

Figure 16:
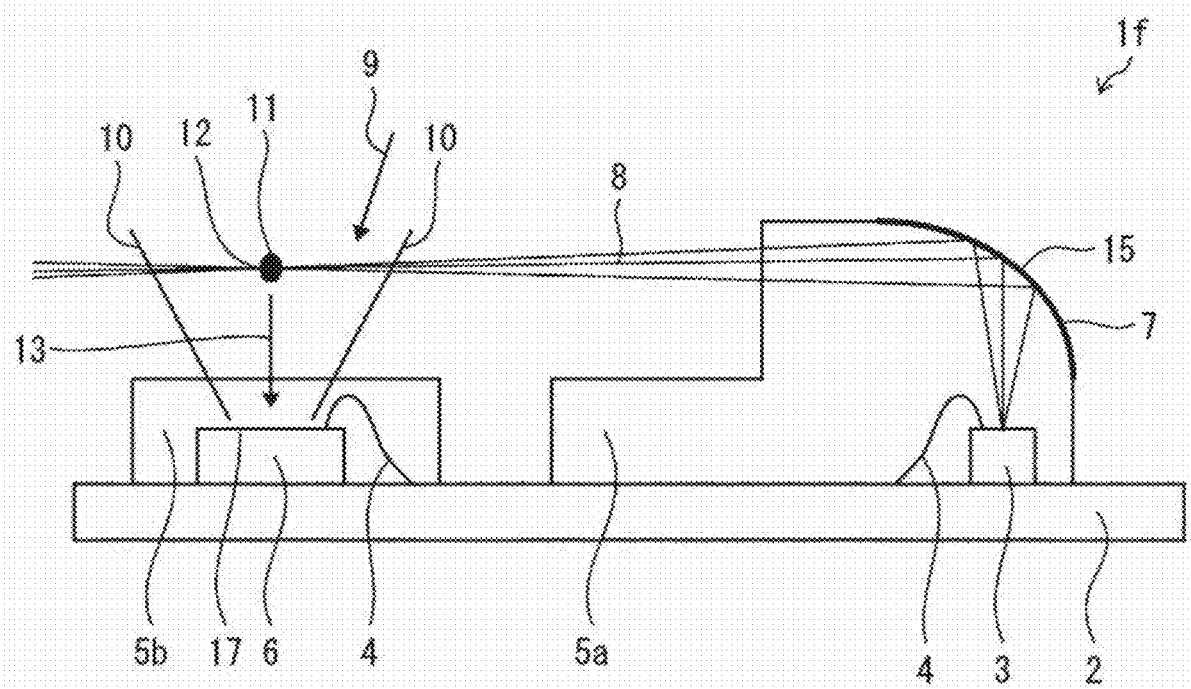
FIG. 16 is a schematic cross-sectional view of the basic configuration of a modification 6 of the particle detection sensor.

FIG. 16 schematically illustrates the cross-section of the basic configuration of a particle detection sensor 1f that includes light transmissive resin 5a and light transmissive resin 5b separated from each other. Referring to FIG. 16, the particle detection sensor 1f reduces stray light 16 (see FIG. 15) that may enter the light receiving element 6 from the light emitting element 3 after being reflected within the light transmissive resin 5. The generation of a current caused by factors other than the scattered light 13 is reduced and shot noise caused in the light receiving element 6 in response to the entrance of the stray light 16 is reduced. S/N ratio is thus increased, and the particle detection sensor 1f capable of stabler detection is implemented.

Modification 7

In the modification 6, a light shielding resin 18 may be arranged, around the light transmissive resin 5b encapsulating the light receiving element 6, in an area that does not block the incident light field area 10 of the light receiving element 6.

Figure 17:
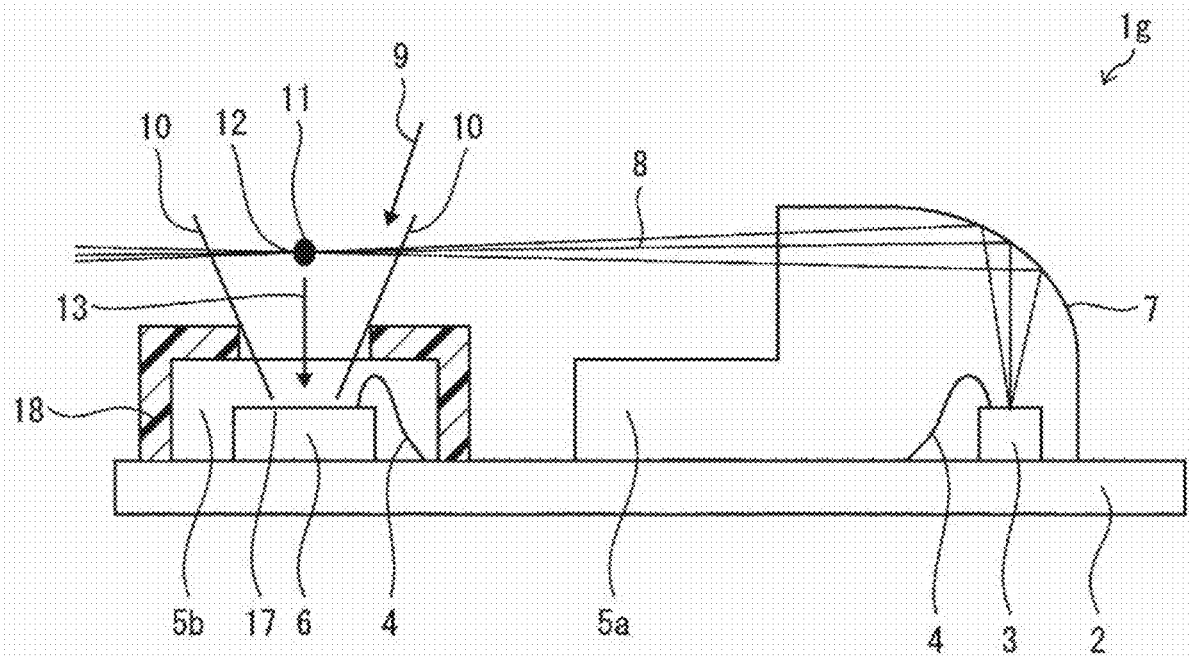
FIG. 17 is a schematic cross-sectional view of the basic configuration of a modification 7 of the particle detection sensor.

FIG. 17 schematically illustrates the cross-section of the basic configuration of a particle detection sensor 1g including the light shielding resin 18. Referring to FIG. 17, the arrangement of the light shielding resin 18 further reduces the stray light 16 from the light emitting element 3. The shot noise generated in the light receiving element 6 by the stray light 16 is further reduced. In this way, the particle detection sensor 1g capable of stabler detection is implemented.

Modification 8

Further in the modification 6, a metal shield 19 may be arranged, around the light transmissive resin 5b encapsulating the light receiving element 6, in an area that does not block the incident light field area 10 of the light receiving element 6.

Figure 18:
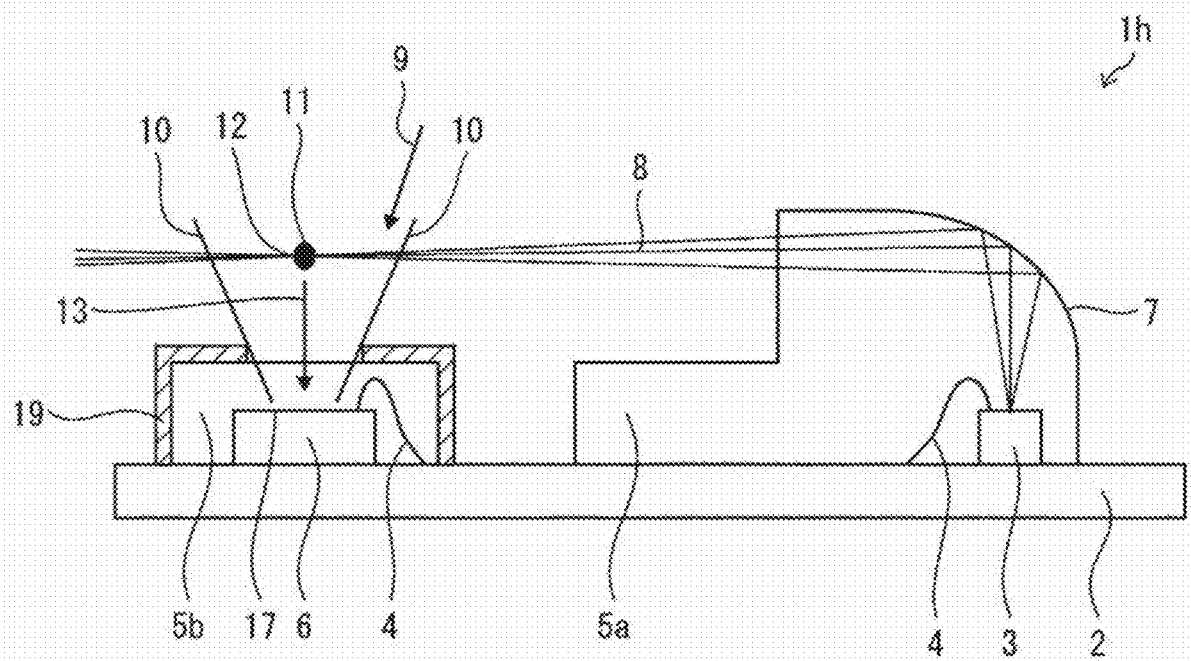
FIG. 18 is a schematic cross-sectional view of the basic configuration of a modification 8 of the particle detection sensor.

FIG. 18 schematically illustrates the cross-section of the basic configuration of a particle detection sensor 1h including the metal shield 19. Referring to FIG. 18, the arrangement of the metal shield 19 not only reduces further the stray light 16 from the light emitting element 3 but also reduces external noise, such as electromagnetic noise entering the light receiving element 6 and the substrate 2 that the light receiving element 6 is connected. In this way, the particle detection sensor 1h capable of stabler detection is implemented.

Second Embodiment

A second embodiment of the present invention is described below. For convenience of explanation, elements identical to those described with reference to the first embodiment are designated with the same reference numerals and the discussion thereof is not repeated herein.

In accordance with the second, an apparatus 50 including the particle detection sensor 1 described with reference to the first embodiment is described blow. The apparatus 50 of the second embodiment desirably includes the particle detection sensor 1 and a fan mounted inside the apparatus 50 to take in the particles 11. The apparatus 50 has a compact and flat design and is capable of stable detection.

(Configuration Example of the Apparatus 50)

Figure 19:
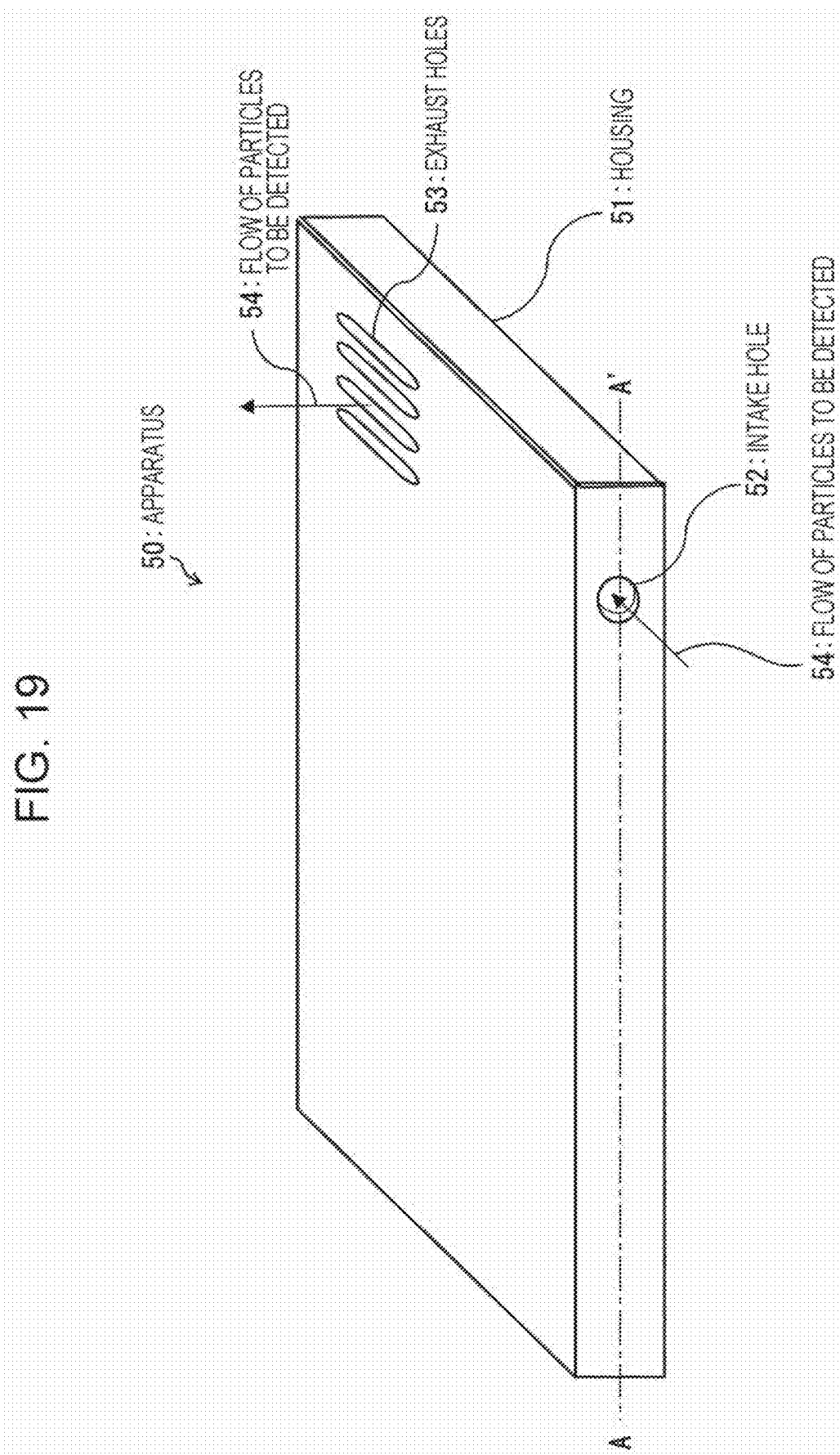
FIG. 19 is a perspective view illustrating a cross-section of the particle detection apparatus of a fifth embodiment.
Figure 20:
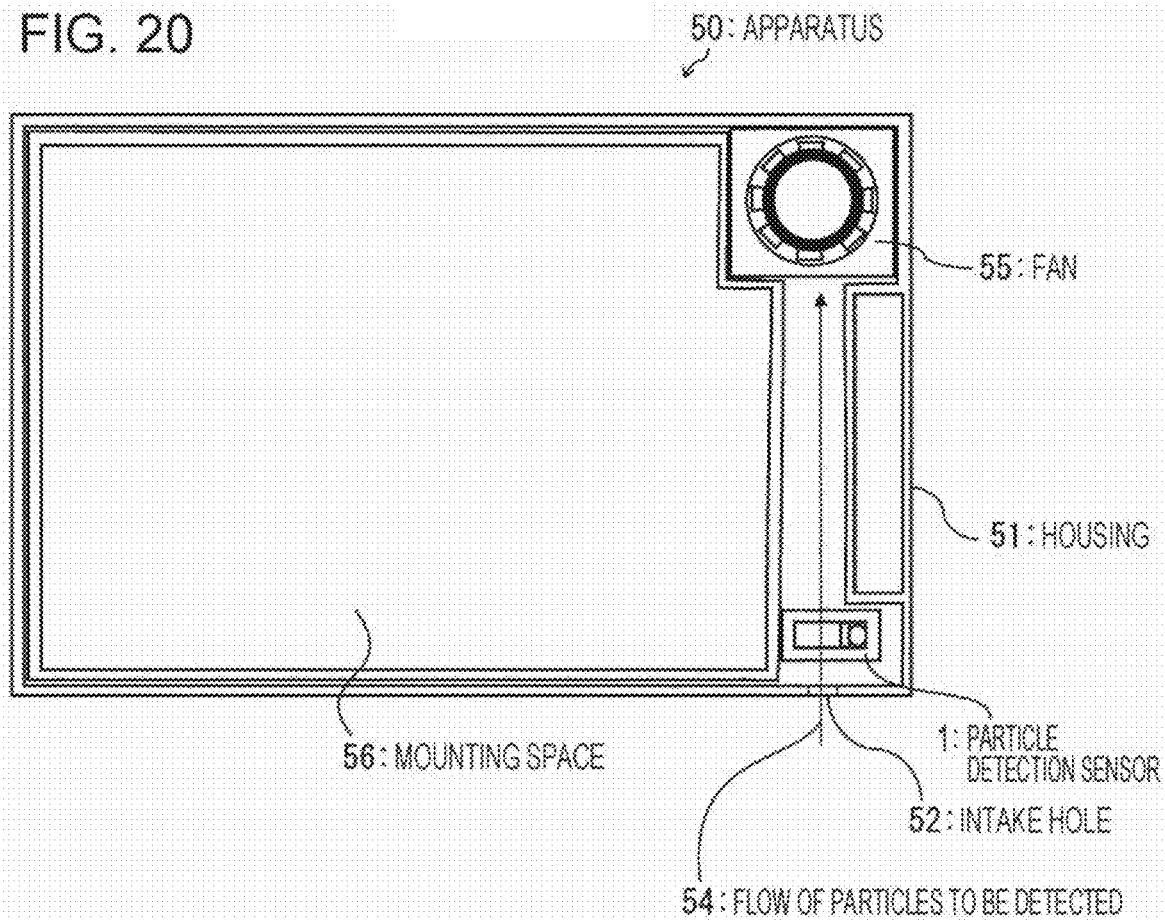
FIG. 20 is a cross-sectional view of the particle detection apparatus in FIG. 19.

FIG. 19 is a schematic diagram of the apparatus 50 of the second embodiment of the present invention. FIG. 20 is a sectional view taken along line A-A' in the schematic diagram in FIG. 19.

The apparatus 50 includes a housing 51 having an intake hole 52 and exhaust holes 53. The particle detection sensor 1 is mounted in the housing 51 and a fan 55 is mounted in the vicinity of the exhaust holes 53. The housing 51 includes a mounting space 56. A variety of apparatuses including an air cleaner and an ion generator may be mounted in the mounting space 56 in accordance with the applications of the apparatus 50.

The apparatus 50 takes in the particles 11 via the intake hole 52 with the fan 55 rotating and then discharges the particles 11. The particle detection sensor 1 is mounted in a manner such the incident light field area 10 of the light receiving element 6 is aligned with a location where the particles 11 from the intake hole 52 pass. In this configuration, the particles 11 taken in via the intake hole 52 by the fan 55 are detected by the particle detection sensor 1.

Since the beam diameter of the output light 8 of the light emitting element 3 is set to be smaller than the formation width of the reflective surface 7 in the particle detection sensor 1, a detection location of the particles 11 is lowered. Also, since the particle detection sensor 1 is free from the mounting of the housing that guides the output light 8, a compact apparatus 50 is implemented.

In accordance with the configuration, the compact and flat designed device 50 is capable of detecting the particles 11. In the configuration, the mounting location of the fan 55 is not limited to any particular location. As long as the configuration takes in the particles 11 via the intake hole 52, the location of the fan 55 does not matter. As long as the particle detection sensor 1 is at the location where the particle 11 passes the incident light field 10 of the light receiving element 6, the location of the particle detection sensor 1 does not matter. In the configuration, the particles 11 are taken in via the intake hole 52. If the fan 55 is mounted in an opposite direction, the flow of the particles 11 may be reversed in direction. More specifically, the particles 11 are taken in via the exhaust holes 53 and discharged via the intake hole 52. As long as the configuration allows the particles 11 to pass across the incident light field area 10 of the light receiving element 6, the direction of the flow of the particles 11 does not matter.

Modifications

Figure 21:
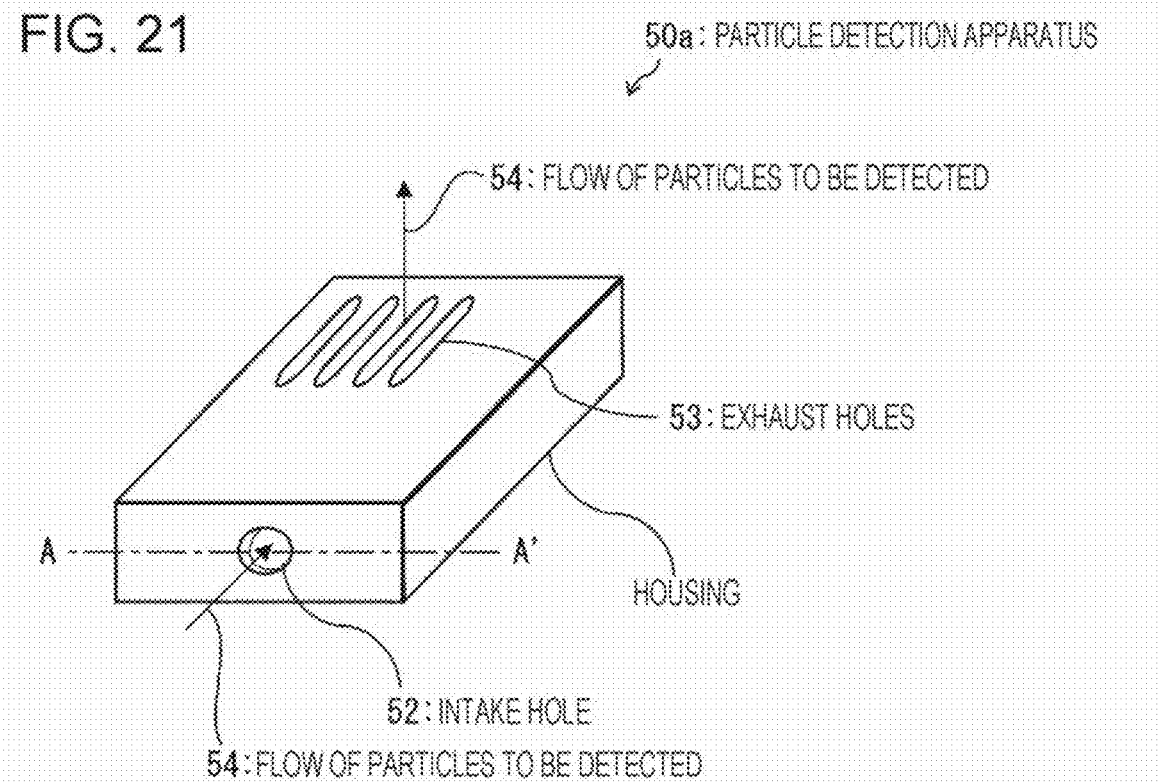
FIG. 21 is a schematic view illustrating a modification of the particle detection apparatus in FIG. 19.

A particle detection apparatus 50a may be constructed by mounting the particle detection sensor 1 and the fan 55 in a compact housing 51a without the mounting space 56. FIG. 21 illustrates the particle detection apparatus 50a including the particle detection sensor 1 and the fan 55. FIG. 22 illustrates a cross-section of the particle detection apparatus 50a taken along line A-A'.

The housing 51a includes the intake hole 52 and the exhaust holes 53. The fan 55 is mounted inside the housing 51a. With the fan 55 rotating, the particles 11 are taken in via the intake hole 52 and discharged via the exhaust holes 53.

In the particle detection apparatus 50a as well, the particle detection sensor 1 is mounted at the location where the particles 11 from the intake hole 52 pass. In this configuration, the particle detection sensor 1 may detect the particles 11 that the fan 55 have taken in via the intake hole 52.

In accordance with the modification, the compact and flat designed particle detection apparatus 50a capable of taking in the particles 11 from outside via the fan 55 may be implemented. The particle detection sensor 1 is thus easily mounted on the particle detection apparatus 50a and the compact and flat designed particle detection apparatus 50a is capable of detecting the particles 11.

In the particle detection apparatus 50a, as described above, the locations of the particle detection sensor 1 and the fan 55 and the direction of the particles 11 do not matter.

CONCLUSION

The particle detection sensor of a first aspect of the present invention includes a light emitting element that outputs light, a light receiving element that detects scattered light caused when a particle within an incident light field area is irradiated with the output light, a light transmissive resin that encapsulates the light emitting element and the light receiving element, and a reflective surface that is formed on the light transmissive resin and reflects the output light radiated from the light emitting element toward the incident light field area.

Since the reflective surface is formed on the light transmissive resin in this configuration, the output light from the light emitting element is guided to the light receiving field without separately arranging the housing or lens. The particle detection sensor that is compact and flat designed and manufacturable at lower cost is thus implemented.

In the particle detection sensor in a second aspect of the present invention in view of the first aspect, a beam diameter of the output light radiated toward the incident light field area is equal to or smaller than a formation width of the formed reflective surface.

Since the widening of the beam diameter of the output light radiated toward the incident light field area is controlled in this configuration, a flat design may be implemented in the particle detection sensor.

In the particle detection sensor in a third aspect of the present invention in view of the second aspect, the reflective surface reflects the output light toward the incident light field area while converging the beam diameter of the output light.

In this configuration described above, the convergence location of the output light is set to be closer to the light incident surface of the light receiving element, and the intensity of the scattered light from the particle entering the light receiving element is thus increased. Stabler detection of the particle is thus possible.

In the particle detection sensor in a fourth aspect of the present invention in view of the first aspect, an angle between a field direction of the incident light field area and an optical axis direction of the output light reflected from the reflective surface is approximately 90 degrees.

In the configuration described above, the light receiving element may appropriately receive the scattered light even without the housing. This configuration also controls stray light that results from the output light directly entering the light receiving element from the light emitting element. The shot noise caused by the stray light is eliminated. Stabler detection with increased S/N (signal noise ratio) is possible.

In the particle detection sensor in a fifth aspect of the present invention in view of the first aspect, a ratio of a full width at half a maximum of an intensity distribution of the output light reflected from the reflective surface to a width at an intensity of $1/e^2$ is larger than a ratio in a Gaussian distribution.

In the configuration described above, the intensity distribution of the output light formed on the reflective surface has a constant beam intensity portion at a center area with narrow skirt portions on both sides of the intensity distribution and is different from the Gaussian distribution that has wider spread skirt portions. This configuration reduces in the signal intensity of the light receiving element variations that are generated depending on the location of the particle that passes across the beam convergence location of the output light. Stabler detection of the particle is thus possible.

In the particle detection sensor in a sixth aspect of the present invention in view of the first through fifth aspects, the output light is infrared light, the light receiving element is sensitive in an infrared wave region, and the light transmissive resin does not transmit visible light but transmits the infrared light.

Since the configuration described above eliminates the effect of disturbance light, such as indoor light and sunlight, stabler detection of the particle is possible.

In the particle detection sensor in a seventh aspect of the present invention in view of the first through fifth aspects, the light emitting element is VCSEL (Vertical Cavity Surface Emitting LASER).

In the configuration described above, the beam diameter of the output light is converged to a smaller value. The intensity of the scattered light from the particle is thus increased. Stabler detection of the particle is possible and the output of the particle detection sensor is thus stabilized.

In the particle detection sensor in an eighth aspect of the present invention in view of the seventh aspect, the reflective surface is plane.

In the configuration described above, the light emitting element as VCSEL providing a narrow directional angle of the output light is thus free from forming a complicated reflective surface like a toroidal surface. The reflective surface may be formed of a simply formed plane and the particle detection sensor may be easily manufactured.

In the particle detection sensor in a ninth aspect of the present invention in view of the eight aspect, the light emitting element has multiple light emitting points that radiate the output light.

In the configuration described above, the reflective surface is plane. By arranging the light emitting element having multiple light emitting points, the multiple beams of the output light are appropriately radiated to the incident light field area of the light receiving element. Since the frequency of passes of particles that passes across the output light increases, stabler detection of the particle is possible.

In the particle detection sensor in a tenth aspect of the present invention in view of the first through fifth aspects, metallic thin film is vapor-deposited on the reflective surface.

In the configuration described above, the reflectance of the reflective surface increases and the intensity of the output light radiated toward the incident light field area is increased. The intensity of the scattered light from the particles increases, leading to stabler detection.

In the particle detection sensor in an eleventh aspect of the present invention in view of the first through fifth aspects, a light receiving lens is mounted on the light transmissive resin within the incident light field area.

In the configuration described above, the light collection efficiency of the scattered light is increased without separately arranging a lens and the intensity of the scattered light is increased. The particle detection sensor that is low-cost and compact designed is capable of stable detection.

In the particle detection sensor in a twelfth aspect of the present invention in view of the first through fifth aspects, the light emitting element and the light receiving element are respectively encapsulated in separated resins.

Since the configuration described above reduces the stray light that enters from the light emitting element to the light receiving element and that does not contribute to the detection of the particles by the light receiving element, the shot noise created by the stray light is reduced. The light receiving element detects the particles more stably, thereby stabilizing the output of the particle detection sensor.

In the particle detection sensor in a thirteenth aspect of the present invention in view of the twelfth aspect, light shielding resin is applied in a portion excluding the incident light field area.

In the configuration described above, the stray light that does not contribute to the detection of the particles by the light receiving element is further reduced. The output of the particle detection sensor is stabilized.

In the particle detection sensor in a fourteenth aspect of the present invention in view of the first through fifth aspects, a metal shield is arranged in a portion excluding the incident light field area.

The configuration described above reduces the stray light that enters from the light emitting element to the light receiving element and that does not contribute to the detection of the particles by the light receiving element and controls the inflow of electromagnetic noise from outside. This configuration controls abnormal detection in response to an external factor, thereby stabilizing the output of the particle detection sensor.

In the particle detection sensor in a fifteenth aspect of the present invention in view of the first through fifth aspects, a particle detection apparatus includes the particle detection sensor according to one of the first through fifth aspects, a housing in which the particle detection sensor is arranged, and a fan that takes in the particle is arranged within the housing.

In the configuration described above, the particle detection apparatus that is compact and flat designed and manufacturable at low cost is implemented.

The present invention is not limited to the embodiments described above and a variety of modifications may be implemented within the scope defined in the claims. An embodiment obtained by appropriately combining technical means disclosed in the different embodiments may fall within the technical scope of the present invention. A new technical feature may be provided by combining the technical means disclosed in the embodiments.

REFERENCE SIGNS LIST 1, 1a through 1h Particle detection sensor
2 Substrate
3, 3a, 3b Light emitting element
5, 5a, 5b Light transmissive resin
6 Light receiving element
7, 7a Reflective surface
8, 8a, 8b Output light
10 Incident light field area
11 Particle
13 Scattered light
14 Light receiving lens
15 Vapor deposition surface
16 Stray light
18 Light shielding resin
19 Metal shield
23 Signal current
25 Current-to-voltage converter circuit
26 Amplifier circuit unit
27 Light emitting element driving circuit
28 Coupling capacitor
29 Arithmetic processor
30 A/D converter circuit
31 Serial output circuit
32 Arithmetic processing circuit
50 Apparatus
50a Particle detection apparatus
51 Housing
52 Intake hole
53 Exhaust hole
55 Fan

The invention claimed is:

1. A particle detection sensor comprising:
a light emitting element that outputs light,
a light receiving element that detects scattered light caused when a particle within an incident light field area is irradiated with the output light,
a light transmissive resin that encapsulates the light emitting element and the light receiving element, and
a reflective surface that is formed on the light transmissive resin and reflects the output light radiated from the light emitting element toward the incident light field area,
wherein a ratio of a full width at half a maximum of an intensity distribution of the output light reflected from the reflective surface to a width at an intensity of $1/e^2$ is larger than a ratio in a Gaussian distribution.

2. The particle detection sensor according to claim 1, wherein a beam diameter of the output light radiated toward the incident light field area is equal to or smaller than a formation width of the reflective surface.

3. The particle detection sensor according to claim 2, wherein the reflective surface reflects the output light toward the incident light field area while converging the beam diameter of the output light.

4. The particle detection sensor according to claim 1, wherein an angle between a field direction of the incident light field area and an optical axis direction of the output light reflected from the reflective surface is approximately 90 degrees.

5. The particle detection sensor according to claim 1, wherein the output light is infrared light,
wherein the light receiving element is sensitive in an infrared wave region, and
wherein the light transmissive resin does not transmit visible light but transmits the infrared light.

6. The particle detection sensor according to claim 1, wherein the light emitting element is a VCSEL.

7. The particle detection sensor according to claim 6, wherein the reflective surface is a plane.

8. The particle detection sensor according to claim 7, wherein the light emitting element has a plurality of light emitting points that radiates the output light.

9. The particle detection sensor according to claim 1, wherein a metallic thin film is vapor-deposited on the reflective surface.

10. The particle detection sensor according to claim 1, wherein a light receiving lens is mounted on the light transmissive resin within the incident light field area.

11. The particle detection sensor according to claim 1, wherein the light emitting element and the light receiving element are respectively encapsulated in resins separated from each other.

12. The particle detection sensor according to claim 11, wherein a light shielding resin is applied in a portion excluding the incident light field area.

13. The particle detection sensor according to claim 1, wherein a metal shield is arranged in a portion excluding the incident light field area.

14. A particle detection apparatus comprising:
the particle detection sensor according to claim 1, and
a housing in which the particle detection sensor is arranged,
wherein a fan that takes in the particle is arranged within the housing.

* * * * *